US010289768B2

(12) United States Patent
Lee et al.

(10) Patent No.: US 10,289,768 B2
(45) Date of Patent: May 14, 2019

(54) BAGGAGE LOADING SIMULATOR SYSTEM AND METHODS

(71) Applicant: C&D ZODIAC, INC., Huntington Beach, CA (US)

(72) Inventors: Nick Lee, Huntington Beach, CA (US); William Young, Huntington Beach, CA (US); Scott Savian, Huntington Beach, CA (US); Roy Benjamin Sandberg, Huntington Beach, CA (US)

(73) Assignee: C&D ZODIAC, INC., Huntington Beach, CA (US)

( * ) Notice: Subject to any disclaimer, the term of this patent is extended or adjusted under 35 U.S.C. 154(b) by 194 days.

(21) Appl. No.: 15/478,086

(22) Filed: Apr. 3, 2017

(65) Prior Publication Data

US 2017/0286578 A1 Oct. 5, 2017

Related U.S. Application Data

(60) Provisional application No. 62/317,277, filed on Apr. 1, 2016, provisional application No. 62/449,721, filed on Jan. 24, 2017.

(51) Int. Cl.
*G06F 17/50* (2006.01)

(52) U.S. Cl.
CPC .............................. *G06F 17/5009* (2013.01)

(58) Field of Classification Search
CPC ................................................. G06F 17/5009
USPC ............................................................ 703/1
See application file for complete search history.

(56) References Cited

U.S. PATENT DOCUMENTS

| 8,510,086 | B1 | 8/2013 | Winkler |
| 2013/0041855 | A1 | 2/2013 | Scruggs |
| 2014/0197667 | A1 | 7/2014 | Cheung et al. |

OTHER PUBLICATIONS

Marelli et al. "The Role of Computer Simulation in Reducing Airplane Turn Time". Boeing Aero Magazine (1). 1998. p. 1-8.*
Int'l Search Report and Written Opinion issued in PCT/US17/25790 dated Apr. 3, 2017.
Fuchte, J et al. "Cabin Design for Minimum Boarding Time"; Deutscher Luft und Raumfarthkongress 2011; Publication (online) Sep. 2011.

(Continued)

*Primary Examiner* — Eunhee Kim
(74) *Attorney, Agent, or Firm* — Jeffer Mangels; Butler & Mitchell LLP; Brennan C. Swain, Esq.

(57) ABSTRACT

A non-transitory machine-readable medium of a computing device storing an application for simulating the loading of an airframe. The application includes an airframe input module that receives an airframe file having a seat having a seat location and a bin having a bin location and a bin dimensions. The application further includes a passenger profile input module that receives a passenger profile file having a list of passenger profiles, a passenger selection module that selects a passenger from the list of passenger profiles and associates the passenger with the seat, a bag selection module that selects a bag profile from a bag profile file and associates it with the passenger, a bag placement module that simulates placing the bag into the bin based on the bin dimensions, bin location, and bag profile, and an output module that outputs and stores a simulation output associating the bag and the bin.

17 Claims, 17 Drawing Sheets

(56) References Cited

OTHER PUBLICATIONS

Best, A et al. "Ped-Air: A Simulator for Loading, Unloading, and Evacuating Aircraft"; Transportation Research Procedia (PED2014); Publication (online) Oct. 2014.
Milne, R et al. "A new method for boarding passengers onto an airplane"; Journal of Air Transport Management, v. 34 (2014); Publication (online) Jan. 2014.

* cited by examiner

BACK TO FRONT

OUTSIDE TO CENTER

RANDOM

BAGGAGE LOADING SIMULATOR SYSTEM AND METHODS

CROSS REFERENCE TO RELATED APPLICATIONS

This application claims the benefit of U.S. Provisional Application No. 62/317,277, filed Apr. 1, 2016, and U.S. Provisional Application No. 62/449,721, filed Jan. 24, 2017, which are both herein incorporated by reference in their entireties.

FIELD OF THE INVENTION

The present invention relates to a system and methods for simulating the loading of an airframe.

BACKGROUND OF THE INVENTION

The loading of passenger airplanes is often time consuming and can cause airlines to fall behind schedule. Furthermore, the types of bags brought onboard by passengers can often complicate the loading process. Accordingly, a need exists for simulating the loading of an airframe so that the process can be optimized.

SUMMARY OF THE PREFERRED EMBODIMENTS

In accordance with a first aspect of the present invention there is provided a non-transitory machine-readable medium of a computing device storing an application for simulating the loading of an airframe. In a preferred embodiment, the application comprises an airframe input module configured to receive a first airframe file representing a first airframe, the first airframe file having a first seat and a first bin, the first seat having a first seat location and the first bin having a first bin location and a first bin dimensions, a passenger profile input module configured to receive a passenger profile file having a list of passenger profiles, a passenger selection module configured to select from the list of passenger profiles a first passenger, and to associate the first passenger with the first seat, a bag selection module configured to select a first bag profile from a bag profile file and to associate the first bag with the first passenger, a bag placement module configured to simulate the placement of the first bag into the first bin based on the first bin dimensions, the first bin location, and the first bag profile, an output module configured to output and store a first simulation output, wherein the first simulation output associates the first bag with the first bin.

In a preferred embodiment, the application includes a boarding group generating module configured to generate a first boarding group list having a first boarding group, wherein the first boarding group represents at least a subset of seats within the first airframe, a seat selection module configured to select the first seat from the first boarding group, and a bag orientation module configured to simulate the placement of the first bag into the first bin at various orientations, and the bag orientation module is configured to place the first bag into the first bin at a first orientation. Preferably, if the first bag does not fit into the first bin at the first orientation, the bag orientation module is further configured to attempt to place the first bag into the first bin at a second orientation.

In a preferred embodiment, the application includes a convex hull bag placement module, and the first bin further includes a first bin sub-space representing at least a sub-section of the first bin. The bag placement module is configured to determine whether the first bin sub-space is a convex hull, and if the bag placement module determines that the first bin sub-space is a convex hull, the convex hull bag placement module is further configured to determine whether the first bag fits into the first bin sub-space.

In a preferred embodiment, the application includes a non-convex hull bag placement module, and the first bin further includes a first bin sub-space representing at least a sub-section of the first bin. The bag orientation module is further configured to determine whether the first bin sub-space is a non-convex hull, and if the bag orientation module determines that the first bin sub-space is a non-convex hull, the convex hull bag placement module is configured to determine whether the first bag fits into the first bin sub-space. Preferably, the application further includes a bag distance module configured to calculate a first bag distance representing the distance between the first seat and the first bag.

In a preferred embodiment, the application further includes a boarding time module configured to calculate, based on the first bag distance and the first passenger, a first boarding time representing the amount of time for the first passenger to board the first airframe, place the first bag into the first bin, and to sit in the first seat. Preferably, the non-transitory machine-readable medium is further configured to run a second simulation, and the output module is further configured to output and store a second simulation output. In a preferred embodiment, the application further includes a comparison module configured to present for comparison the first simulation output and the second simulation output.

In accordance with another aspect of the present invention there is provided a non-transitory machine-readable medium of a computing device storing an application for simulating the loading of an airframe. The application includes means for receiving a first airframe file representing a first airframe, the first airframe file having a first seat and a first bin, the first seat having a first seat location and the first bin having a first bin location and a first bin dimensions, means for receiving a passenger profile file having a list of passenger profiles, means for selecting from the list of passenger profiles a first passenger, means for associating the first passenger with the first seat, means for selecting a first bag profile from a bag profile file, means for associating the first bag with the first passenger, means for simulating the placement of the first bag into the first bin based on the first bin dimensions, the first bin location, and the first bag profile, means for associating the first bag with the first bin, and means for outputting a first simulation output.

In a preferred embodiment, the non-transitory medium further includes means for generating a first boarding group list having a first boarding group that represents at least a subset of seats within the first airframe, means for selecting the first seat from the first boarding group, and means for simulating the placement of the first bag into the first bin at a first orientation. In a preferred embodiment, if the first bag does not fit into the first bin at the first orientation, the non-transitory medium further includes means for attempting to place the first bag into the first bin at a second orientation.

In a preferred embodiment, the first bin further includes a first bin sub-space, and the non-transitory medium further includes means for determining whether the first bin sub-space is a convex hull, and if it is determined that the first bin sub-space is a convex hull, means for determining whether the first bag fits into the first bin sub-space.

In a preferred embodiment, the first bin further includes a first bin sub-space, and the non-transitory medium further includes means for determining whether the first bin sub-space is a non-convex hull, and if it is determined that the first bin sub-space is a non-convex hull, means for determining whether the first bag fits into the first bin sub-space. Preferably, the non-transitory medium further includes means for calculating a first bag distance representing the distance between the first seat and the first bag.

Preferably, the non-transitory medium further includes means for calculating, based on the first bag distance and the first passenger, a first boarding time representing the amount of time for the first passenger to board the first airframe, place the first bag into the first bin, and to sit in the first seat. In a preferred embodiment, the non-transitory machine-readable medium further includes means for running a second simulation, means for storing a second simulation output, and means for outputting a second simulation output. In a preferred embodiment, the non-transitory machine-readable medium further includes means for presenting for comparison the first simulation output and the second simulation output.

In accordance with another aspect of the present invention there is provided a computer-implemented method for simulating the loading of an airframe. The computer-implemented method includes the steps of receiving a first airframe file representing a first airframe, the first airframe file having a first seat and a first bin, the first seat having a first seat location and the first bin having a first bin location and a first bin dimensions, receiving a passenger profile file having a list of passenger profiles, selecting from the list of passenger profiles a first passenger, associating the first passenger with the first seat, selecting a first bag profile from a bag profile file, associating the first bag with the first passenger, simulating the placement of the first bag into the first bin based on the first bin dimensions, the first bin location, and the first bag profile, associating the first bag with the first bin, and outputting a first simulation output.

In a preferred embodiment, the computer-implemented method further includes the steps of generating a first boarding group list having a first boarding group that represents at least a subset of seats within the first airframe, selecting the first seat from the first boarding group, and simulating the placement of the first bag into the first bin at a first orientation, if the first bag does not fit into the first bin at the first orientation, attempting to place the first bag into the first bin at a second orientation, calculating a first bag distance representing the distance between the first seat and the first bag, and then calculating, based on the first bag distance and the first passenger, a first boarding time representing the amount of time it takes for the first passenger to board the first airframe, place the first bag into the first bin, and to sit in the first seat.

The invention, together with additional features and advantages thereof, may be best understood by reference to the following description.

BRIEF DESCRIPTION OF THE DRAWINGS

Like numerals refer to like components throughout the several views of the drawings.

DETAILED DESCRIPTION OF THE PREFERRED EMBODIMENTS

Figure 1:
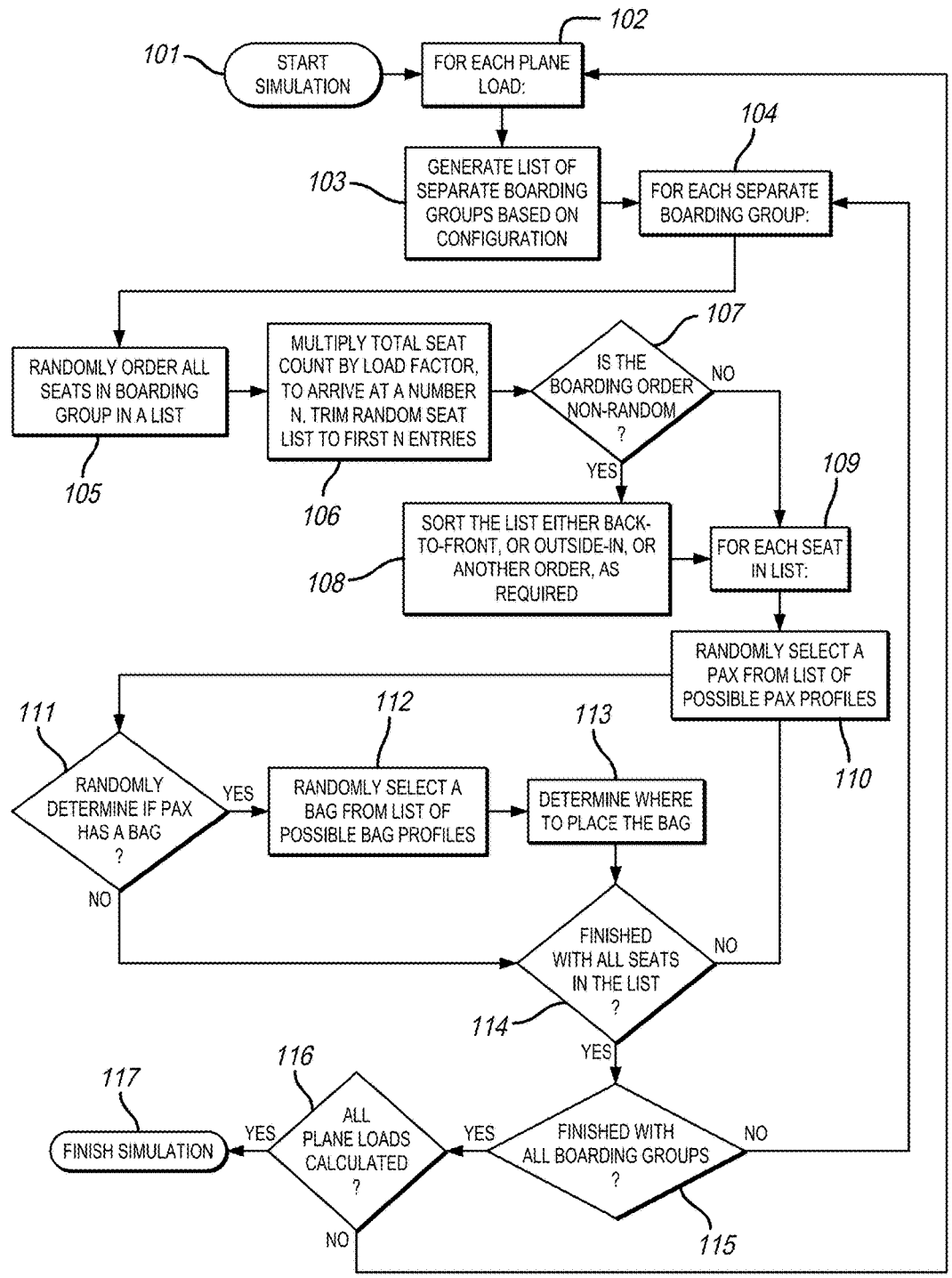
FIG. 1 is a flow chart showing the steps performed to simulate the loading of an airframe in accordance with a preferred embodiment of the present invention.

The following description and drawings are illustrative and are not to be construed as limiting. Numerous specific details are described to provide a thorough understanding of the disclosure. However, in certain instances, well-known or conventional details are not described in order to avoid obscuring the description. References to one or another embodiment in the present disclosure can be, but not necessarily are, references to the same embodiment; and, such references mean at least one of the embodiments.

Reference in this specification to "one embodiment" or "an embodiment" means that a particular feature, structure, or characteristic described in connection with the embodiment is included in at least one embodiment of the disclosure. Appearances of the phrase "in one embodiment" in various places in the specification do not necessarily refer to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks: The use of highlighting has no influence on the scope and meaning of a term; the scope and meaning of a term is the same, in the same context, whether or not it is highlighted. It will be appreciated that the same thing can be said in more than one way.

Consequently, alternative language and synonyms may be used for any one or more of the terms discussed herein. Nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any exemplified term. Likewise, the disclosure is not limited to various embodiments given in this specification.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

It will be appreciated that terms such as "front," "back," "top," "bottom," "side," "short," "long," "up," "down," and "below" used herein are merely for ease of description and refer to the orientation of the components as shown in the figures. It should be understood that any orientation of the components described herein is within the scope of the present invention.

In a preferred embodiment of the present invention, functionality is implemented as software executing on a personal computer capable of receiving input commands, processing data, and outputting results to a display. Those of ordinary skill in the art will appreciate that functionality may be implemented as software running on one or more server(s) that in connection, via a network, with other portions of the system, including mobile devices, terminals, databases and external services, on a mobile device, or on any other computing device capable of receiving input commands, processing data, and outputting the results for the user. Preferably, the personal computer consists of RAM (memory), hard disk, network, central processing unit (CPU). It will be understood and appreciated by those of skill in the art that the personal computer could be replaced with, or augmented by, any number of other computer device types or processing units, including but not limited to a desktop computer, laptop computer, mobile or tablet device, terminal, or the like. Similarly, the hard disk could be replaced with any number of computer storage devices, including flash drives, removable media storage devices (CDs, DVDs, etc.), or the like.

A network can consist of any network type, including but not limited to a local area network (LAN), wide area network (WAN), and/or the internet. The server can consist of any computing device or combination thereof, including but not limited to the computing devices described herein, such as a desktop computer, laptop computer, mobile or tablet device, as well as storage devices that may be connected to the network, such as hard drives, flash drives, removable media storage devices, or the like.

Storage devices (e.g., hard disk, another server, a NAS, or other devices known to persons of ordinary skill in the art), are intended to be nonvolatile, computer readable storage media to provide storage of computer-executable instructions, data structures, program modules, and other data for the mobile app, which are executed by CPU/processor (or the corresponding processor of such other components). The various components of the present invention, are stored or recorded on a hard disk or other like storage devices described above, which may be accessed and utilized by a web browser, mobile app, the server (over the network), or any of the peripheral devices described herein. One or more of the modules or steps of the present invention also may be stored or recorded on the server, and transmitted over the network, to be accessed and utilized by a web browser, a mobile app, or any other computing device that may be connected to one or more of the web browser, the mobile app, the network, and/or the server.

References to a "database" or to "database table" are intended to encompass any system for storing data and any data structures therein, including relational database management systems and any tables therein, non-relational database management systems, document-oriented databases, NoSQL databases, or any other system for storing data.

Software and web or internet implementations of the present invention could be accomplished with standard programming techniques with logic to accomplish the various steps of the present invention described herein. It should also be noted that the terms "component," "module," or "step," as may be used herein, are intended to encompass implementations using one or more lines of software code, macro instructions, hardware implementations, and/or equipment for receiving manual inputs, as will be well understood and appreciated by those of ordinary skill in the art. Such software code, modules, or elements may be implemented with any programming or scripting language such as C, C++, C#, Java, Cobol, assembler, PERL, Python, PHP, or the like, or macros using Excel or other similar or related applications with various algorithms being implemented with any combination of data structures, objects, processes, routines or other programming elements.

Generally, in a preferred embodiment, there is defined a layout of passenger accommodations (LOPA) for an airframe (also referred to herein as an airframe; those of ordinary skill in the art will appreciate that a digital representation of an airframe, rather than a physical airframe, is utilized in accordance with the preferred embodiment) defined in an airframe data 810. Further, simulation parameters for the operation of a simulation can be defined in the airframe data 810. Those of ordinary skill in the art will understand that the term "pax" refers to passenger(s).

In a preferred embodiment, the airframe data is loaded and then a "what you see is what you get" (WYSIWYG), or accurately scaled, graphical, view of a first airframe is presented, allowing users to see seats, monuments, exits, dividers, and bins on an airframe. Preferably, a second file can be loaded, representing a second airframe. Those of ordinary skill in the art will appreciate that any number of airframes can be loaded for simulation and for the comparison of simulation results. For example, one may be able to run multiple simulations of the loading of the first airframe, and comparisons between multiple simulation runs, in which the simulations have varying passenger loads, a different distribution of different kinds of bags, different bin systems, or different seating arrangements. However, those of ordinary skill in the art will appreciate that any parameter relevant to the loading of an airframe may be varied and used in a simulation, and that the results those multiple simulations may then be compared, or averaged and then compared.

Each time an airframe data is loaded in accordance with a preferred embodiment, three window panes are displayed. The top pane is the WYSIWYG LOPA plus baggage view, which displays the layout of the airframe, the location of passengers, and the placement of bags into bins. Beneath that is a second widow that initially shows a typical bag load. By way of example, if an airframe fits 200 passengers and 90%, or 100% of the passengers board, then only 90% of the passengers have bags, then the simulation result will show that 80 bags have been loaded on to the airframe. So, preferably, bags will be picked at random from a bag profile data. Thus, in a preferred embodiment, a randomly selected group of bags is selected based on a predetermined distribution of bags in the bag profile data.

Thus, preferably, there is displayed a visualization window for the bags that either are not on the plane, or were taken off the plane. When the simulation is run, preferably, any bags that were checked at the gate are displayed, if that option is enabled, as are any bags that were offloaded during the boarding process (for example, if the bags do not fit anywhere on board).

In a preferred embodiment, there is displayed a third window. Preferably, this third window displays configuration data retrieved from the airframe data, which is then used to set up the simulation. In a preferred embodiment, the configuration data is loaded with default values that are in the airframe data. However, those of ordinary skill in the art will appreciate that the configuration data can also be modified on the fly by the user, so that the user can load an airframe data and then make changes to it before or during the simulation process. That way, users can receive faster feedback and simulation results as they adjust the configuration data.

Preferably, there is also provided a results window in which the results from a simulation run are displayed. In a preferred embodiment, the results are saved to memory and can be exported as an excel spreadsheet. However, those of ordinary skill in the art will appreciate that simulation results may be saved to a file, a database, or any other structure for storing data, and that the simulation results may be exported as a .docx, .doc, .txt, or any other type of file or data structure capable of storing the simulation results data. Those of ordinary skill in the art will appreciate that the windows and/or panes described above are merely exemplary and that the functionality provided and data displayed can be provided and displayed by any combination or number of windows and/or panes.

In a preferred embodiment, there is a presentation mode. In presentation mode, an hypertext markup language (HTML)-formatted file is displayed. Preferably, users may add predefined variable names, and values, representing the names of simulation output variables, to the HTML-formatted file. These predefined variable names will then be associated with the actual results from a simulation each time a new simulation is run. In this way, a user-defined presentation may be quickly generated following each simulation.

Preferably, the number of bags on an airframe is determined during a simulation based on values set within the airframe data. Specifically, in a preferred embodiment, the airframe data specifies the number of seats on the airframe, the percentage of those seats that will be occupied (load factor), and the bags per passenger, which is a number one or less. Thus, by way of example, if an airframe has 100 seats, a 50% load factor, and 50% of passengers have bags, then in an ideal simulation, there would be 25 bags. However, preferably, each simulation provides real-world, rather than idealized, results. That is, if, by way of example, the load factor is 50% half of the seats will in fact be full; however, if there is, by way of example, a 50% likelihood of a simulated passenger having a bag, in reality, each time a passenger boards the airframe, that passenger will have a 50% chance of having a bag. Thus, the passenger gets on the plane, and then the 50% probability is applied per passenger. Thus, preferably, with all other variables being equal, multiple simulation runs may result in differing bag loads.

In a preferred embodiment, there is a predefined "distance to look ahead" value. Preferably, the distance to look ahead value is used to model the idea that when a passenger boards an airframe with a carry-on bag, the passenger might scan for empty bins, and if the airframe is nearly empty, the passenger might stash the bag in the bin right by her seat. However, if bins on the airframe are filling up, the passenger may be desperate for a place for the carry-on bag, so the passenger scans ahead to other, nearby bins, to represent that the passenger is deciding to walk to place her bag in a more distant bin. Thus, preferably, there is a predefined distance to look ahead value representing how many inches ahead a passenger scans for an available bin when boarding. Those of ordinary skill in the art will appreciate that the distance represented by the distance to look ahead value may be measured in any unit of distance. Preferably, a comparison of multiple simulation runs will compare the bins in each simulation run by length rather than by number, to account for the fact that bins may be of differing lengths. In a preferred embodiment, a passenger might also place bags behind the associated seat. Preferably, for example, if the distance to look ahead value is set at 100 inches, it would represent a passenger looking for an available bin 50 inches in front of her assigned seat and 50 inches after her assigned seat. In a preferred embodiment, a number of iterations of a monte carlo simulations can be predefined.

Referring now to the drawings, wherein the showings are for purposes of illustrating the present invention and not for purposes of limiting the same, FIGS. 1-7 show the steps performed in accordance with a preferred embodiment.

FIG. 1 is a flow chart depicting an algorithm for simulating the loading of an airframe performed in accordance with a preferred embodiment. The simulation begins 101 by analyzing each plane load 102 in sequence. Each plane load represents a single simulation instance, thus, by way of example, if a simulation is run for 500 iterations, then 500 plane loads must be performed. As shown in FIG. 1, for each plane load, preferably, a list of boarding groups is generated 103, with each boarding group in the list representing at least a subset of the seats on an airframe. For example, first class passengers might form a first boarding group, and they might board independently of the remaining passengers. Further, those of ordinary skill in the art will appreciate that the intermediate step of generating a list of boarding groups is merely exemplary and that any method of dividing seats on an airframe into boarding groups may be utilized, or that the intermediate step of generating a list of boarding groups may be omitted.

As shown in FIG. 1, for each separate boarding group 104, all seating locations associated with that boarding group are randomly ordered 105. In order to account for a load factor (which is the fraction or percentage of seats filled), the total available seats on an airframe are multiplied by the load factor, arriving at a reduced seat count N. The boarding group list 105 is then trimmed to the first N entries 106. Because the list was randomly generated, the trimmed list is still a random selection of seats, but is now sparsely populated in the correct ratio. Preferably, it is then determined whether the boarding order is non-random 107; if it is, the remaining seats are sorted as desired 108. In a preferred embodiment, a user can select non-random boarding orders such as back-to-front and outside-in. However, those of ordinary skill in the art will appreciate that other boarding orders may be utilized to fill the airframe as well. If a user selects a random passenger boarding order, no sorting of the boarding group list is required and the algorithm moves on to step 109.

Then, for each seat in the boarding group list 109, a passenger profile is randomly selected from a list of passenger profiles 110 (the list also referred to herein as passenger profile data). In a preferred embodiment, the passenger profile data is loaded from a file. However, those of ordinary skill in the art will appreciate that the passenger profile data may be loaded from a database, a version management system, a queue, or any other apparatus, structure, or method for storing data. The passenger profile data may also be generated by the software itself, from default values, without a reliance on external data sources.

The passenger profile data is a list of at least one passenger profile. Each passenger profile represents a theoretical passenger and includes information relating to that passenger. Preferably, each passenger profile will include information such as the passenger's walking speed, the amount of time for the passenger to sit in a seat, the amount of time for the passenger to offload her bag, the amount of time for the passenger to place her bag in a bin, the amount of time for the passenger to pass another passenger, the amount of time for the passenger to place her bag under her seat, and the amount of time for the passenger to gate check her bag, if necessary. In this way, passenger loading times can be simulated in a manner that accounts for idiosyncratic differences between passengers. However, those of ordinary skill in the art will appreciate that the types of information in a passenger profile detailed above merely exemplary, and that a passenger profile may contain any information relating to the boarding of an airframe by the passenger.

In a preferred embodiment, for each passenger, it is determined 111 whether the passenger has a bag. Preferably, this is done by referring to and applying a historical distribution of bags across passengers. However, those of ordinary skill in the art will appreciate that the determination may be made randomly, or based on any other metric for the distribution of bags across passengers.

In a preferred embodiment, if it is determined the passenger does have a bag, a bag profile is randomly selected from a list of bag profiles (the list of bag profiles also referred to herein as bag profile data) 112. Preferably, the bag profile data is loaded from a file. However, those of ordinary skill in the art will appreciate that the bag profile data may be loaded from a database, a version management system, a queue, or any other apparatus, structure, or method for storing data. Those of ordinary skill in the art will also appreciate that the bag profile data may be generated by or defined within the software itself, using default values, without relation to any external data sources. In a preferred embodiment, a bag profile includes the length, width, depth, and weight of the bag. Then, for each bag, an algorithm, further described with reference to FIG. 2 below, is utilized to determine 113 where to place the bag.

As shown in FIG. 1, in a preferred embodiment, each seat in the boarding group list is then processed 114 as described above, and each boarding group is then processed in turn 115. This process is repeated for all plane loads 116. Preferably, all of the data related to placement of bags into bins and of passengers into seats is stored in RAM, and made available for subsequent analysis. At this point the simulation process is concluded 117.

Figure 2:
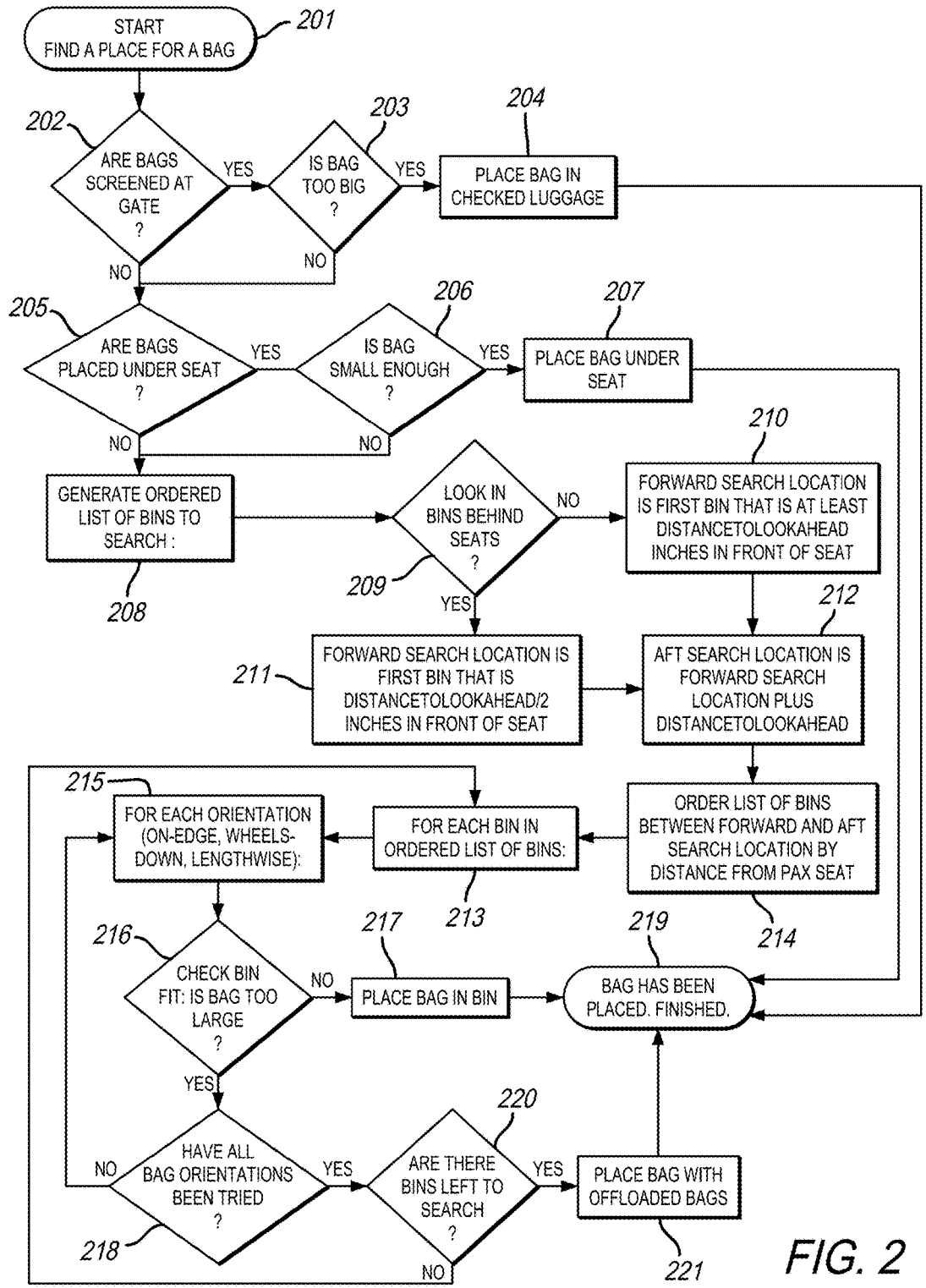
FIG. 2 is a flow chart showing the steps performed to simulate the placement of a bag within the airframe in accordance with a preferred embodiment of the present invention.

FIG. 2 is a flow chart illustrating the algorithm used to determine where to place each bag during the simulation process. For each bag 201, the process begins by checking if bags are to be screened at the gate 202; if so, a preconfigured maximum checked bag size dimension (length, width, and depth) is used to determine 203 if the bag is too large to be brought on the plane.

If the bag is too large, preferably, the bag is then placed into checked luggage 204, and this state is recorded for future analysis, and the bag placement process concludes 219.

Otherwise, as shown in FIG. 2, a determination is made 205 regarding whether the bags may be placed underneath the boarding passenger's seat. Preferably, this determination is made based on airframe data (described in further detail with reference to FIG. 8 below), which contains information about the airframe being loaded and parameters for the simulation. If under-seat stowage is allowed, and if the bag is small enough relative to a pre-configured dimension (length, width, and depth) 206, then the bag is placed under the seat, the state is recorded for future analysis, and then the bag placement process concludes 219.

In a preferred embodiment, as shown in FIG. 2, a list of bins to check for space is created 208. Preferably, if a parameter in the airframe data instructs the simulation to only look at bins to the fore of the passenger's seat 209, then the search for empty bins begins at some distance (distanceToLookAhead, as defined in the airframe data) to the fore of the passenger's seat, or the start of the airframe, whichever is shorter 210. However, those of ordinary skill in the art will appreciate that any other method for determining how far from her seat a passenger should look for an available bin may be utilized. For example, this determination may be based on a value set within the passenger profile data.

Preferably, as shown in FIG. 2, if the simulation should also look behind the seat, then the first bin to check is located at distanceToLookAhead/2 inches before the passenger's seat, or the fore of the airframe, whichever is shorter 211.

The last bin to check is located at distanceToLookAhead/2 inches after the passengers seat, or the end of the aircraft, whichever is shorter 212.

In a preferred embodiment, as shown in FIG. 2, having generated a list of each bin that meets the distance requirement, the list is then sorted by distance from the passenger's seat 214. In this way, the most conveniently located bins are the first ones are filled when placing the passenger's bag. Preferably, for each bin in this ordered list 213, it is attempted to place the bag in the bin in three progressively less space efficient orientations (on-edge, wheels-down, and lengthwise) 215. However, it will be appreciated by those of ordinary skill in the art that these orientations are merely exemplary and that one or more of any orientation may be used to place a bag.

As shown in FIG. 2, in a preferred embodiment, for each orientation, a check is then made to determine if the bag can be accommodated in the bin 216. If the bag fits, the bag is placed in the bin 217, this state is recorded for future analysis, and the bag placement process concludes 219.

Preferably, as shown in FIG. 2, this process is repeated for all three bag orientations 218, for all bins in the list of bins to check 220. If the bag is not placed in any of the bins in any orientation, it is placed with offloaded bags 221, this state is recorded for future analysis, and the bag placement process concludes 219.

Figure 3:
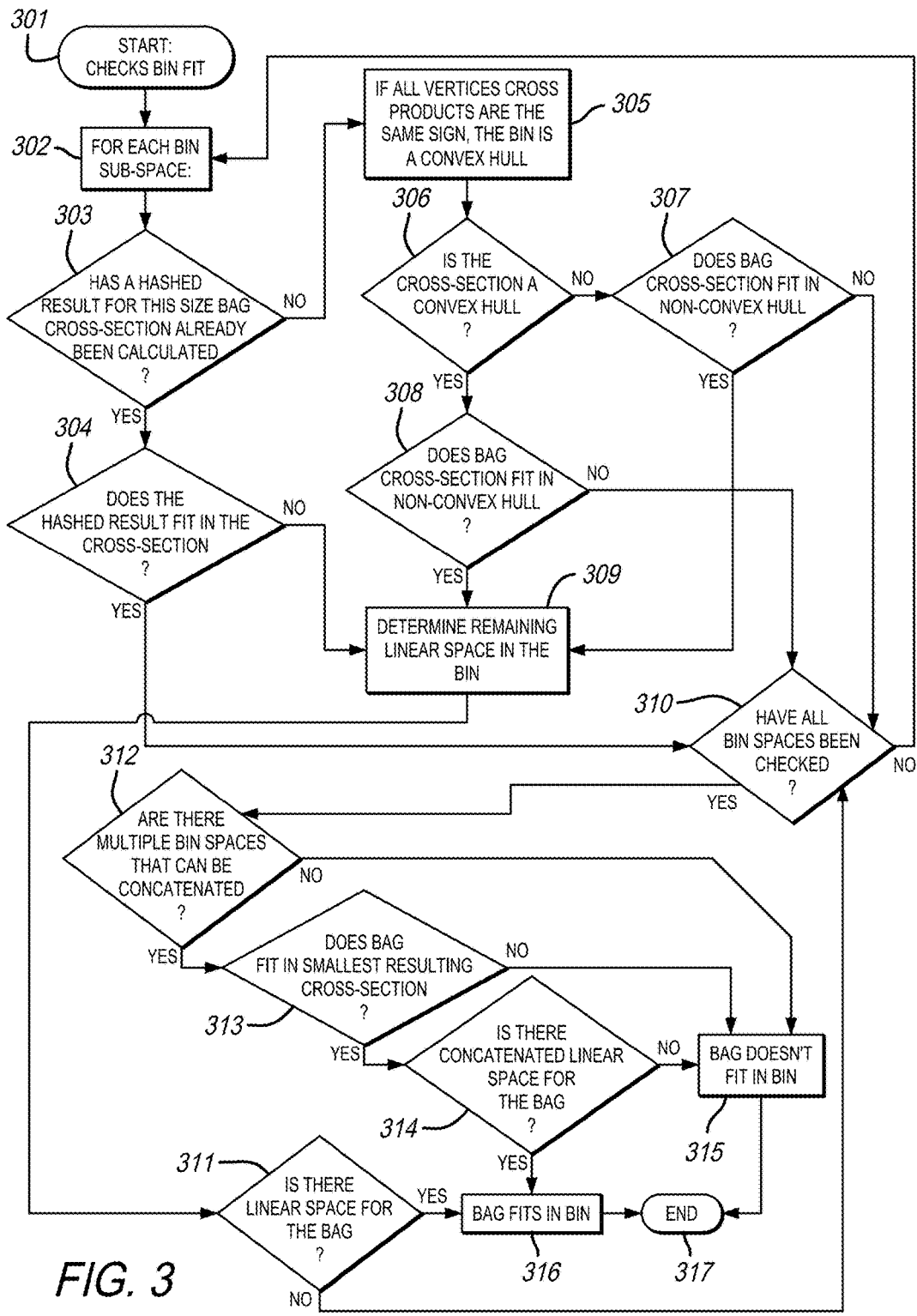
FIG. 3 is a flow chart illustrating the steps performed to determine whether a bag fits within a bin in accordance with a preferred embodiment of the present invention.

FIG. 3 is a flow chart illustrating an algorithm used in accordance with a preferred embodiment to determine whether a bag fits within a bin. Preferably, the algorithm starts 301 by checking each subspace of the bin 302. As some bins may have multiple internal spaces (as, for example, might occur with bins having a central rib dividing a bin), it is sometimes necessary to subdivide the bin into spaces.

Preferably, as shown in FIG. 3, each bag is presented to the algorithm in a particular orientation (on-edge, wheels-down, or lengthwise). Each of these orientations presents a particular cross-section which is compared to the cross-section of the bin. A unique hash value is created for the bag cross-section using the bag length and width (relative to the cross-section, and so differing depending on bag orientation). If a bag fit for a given hash value has already been determined 303, that result is used 304.

In a preferred embodiment, as shown in FIG. 3, otherwise, a check to establish whether the bin is a convex hull (one with all interior angles 180 degrees or smaller) or a non-convex hull 305. A non-convex hull is much more computationally expensive to compute bag fits for, but it is often the only way to accurately model a bin cross-section. Consequently, preferably, both methods, for fitting a bag into a convex hull and into a non-convex hull are provided, and the algorithm proceeds 306 based on the result of the determination.

If the hull is a non-convex hull, the non-convex hull fitting algorithm is executed 307. If the hull is a convex hull, then the convex hull fitting algorithm is executed 308. In either case, if the bag cross-section doesn't fit completely within the bin cross-section, the algorithm attempts to place the bag into the next sub-space within the bin 310.

Preferably, if the bag does fit within the cross-section, a check is made to be sure that there is enough linear space (bin shelf length) to accommodate the bag in its present orientation 311. Then, if the bag length is greater than the remaining shelf length within the bin, the algorithm attempts to place the bag in the next space within the bin 310.

In a preferred embodiment, as shown in FIG. 3, if there is sufficient linear space for the bag 311, then it is placed in the bin 316, and the algorithm comes to an end 317.

Preferably, this process repeats 310 for each space in the bin 302. If all spaces have been tried, and the bag still has not been placed, an attempt is made to concatenate multiple spaces together 312, if they are found. For example, if the bin has a central rib, there is a volume across the rib that is smaller in cross-section, but greater in shelf length. Concatenating these volumes may result in a volume able to accommodate a bag, in a situation where the individual spaces may not. If the bag fits within the smaller cross-section 313, and the concatenated linear space (shelf length) is sufficient 314, then the bag is placed in the bin 316, and the algorithm comes to an end 317.

In a preferred embodiment, as shown in FIG. 2, if there are no spaces to be concatenated 312, or if the bag does not fit into the smaller concatenated cross-section 313, or if there is insufficient concatenated linear space 314, then the bag does not fit in the bin 315, and the algorithm comes to an end 317.

Figure 4:
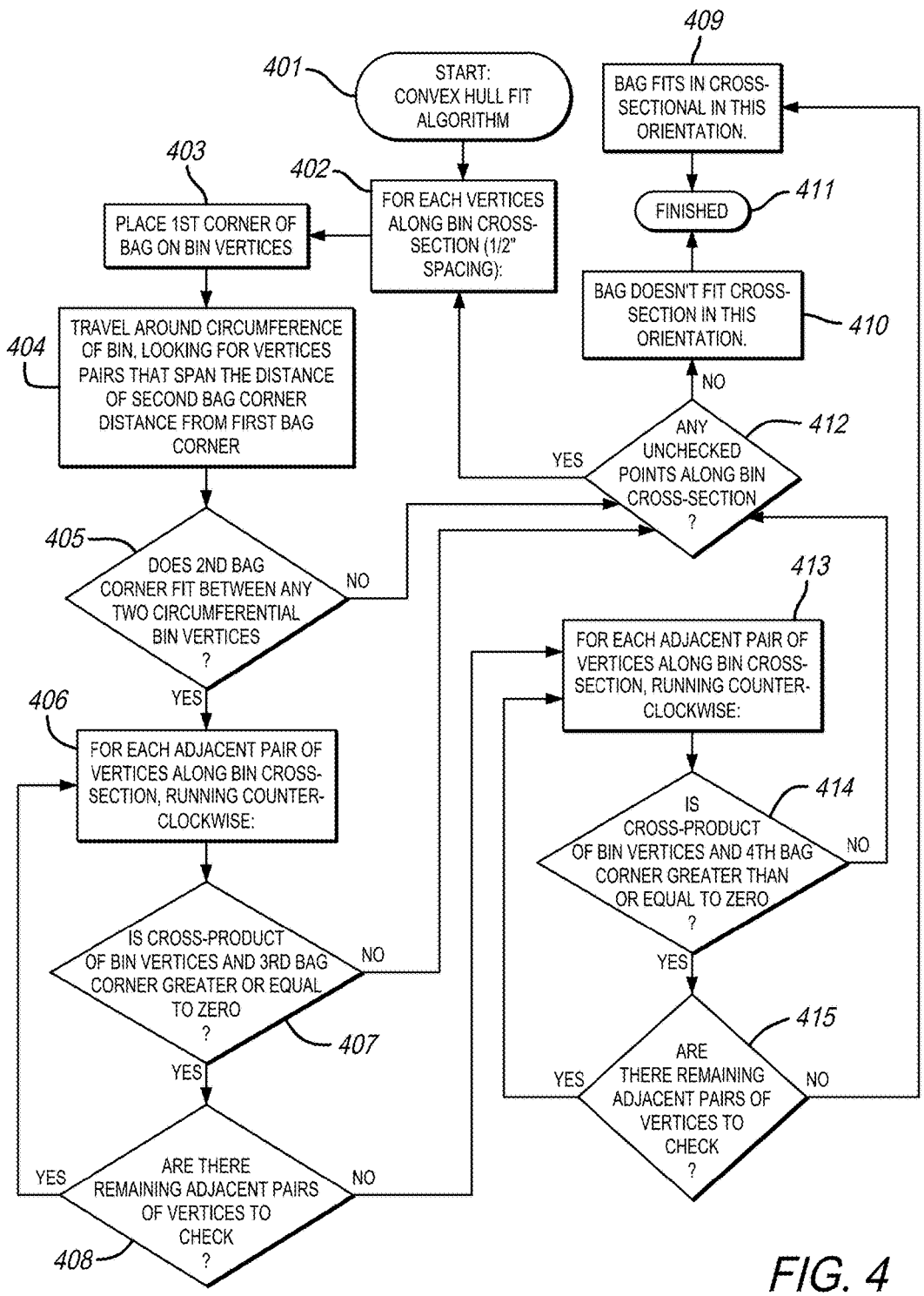
FIG. 4 is a flow chart illustrating the steps performed to determine whether a cross-section of a bag fits within a bin cross-section where the bin cross-section is a convex hull.

FIG. 4 is a flow chart illustrating the algorithm used to determine whether a bag cross-section fits within a bin cross-section where the bin cross-section is a convex hull.

Preferably, the algorithm starts 401 with the assumption that the bin cross-section having a convex hull has a high density of vertices. In a preferred embodiment, the density of the vertices is at least one vertex located in every ½" of the bin cross-section. However, those of ordinary skill in the art will appreciate that any other density may be used, which may result in a change to the computational time, and may have an impact on the accuracy of the results.

Then, preferably, as shown in FIG. 4, for each of the vertices along the bin cross-section 402, an arbitrary corner of the bag, referred to as the first corner, is placed coincident with the vertex being processed (also referred to herein as the "query vertex") 403. Then, a second bag corner is chosen adjacent to the first corner. The remaining bin vertex-adjacent pairs are measured for their linear distance from the query vertex 404. If the adjacent pairs straddle the distance (one higher, one lower) between the second bag corner and the first bag corner 405, this represents the location that the second corner would fall when placed within the bin. If no such location is found, then the second bag corner is outside the bin, and the bag will not fit in this position. The algorithm then continues to the next bin vertex 402.

In a preferred embodiment, if the second corner position is found, the third and fourth corners are then rotated to match the orientation of the bag that resulted in the position of the second corner. Preferably, each adjacent pair of vertices along the bin hull is then processed 406, to determine if the third bag corner is within the hull. If the cross-product of the bin vertex pairs and the third bag corner is greater than or equal to zero 407, then the third bag corner is outside the convex hull, and the bag will not fit in this position. The algorithm continues to the next bin vertex 402 and continues to process additional adjacent pairs of bin vertices 408. If all remaining adjacent bin vertex pairs 408 also result in a value less than zero, then the third corner fits, and the fourth corner is then processed 413.

As shown in FIG. 4, preferably, each adjacent pair of vertices along the bin hull is again processed 413, this time to determine if the fourth bag corner is within the hull. If the cross-product of the bin vertex pairs and the fourth bag corner is greater than or equal to zero 414, then the fourth bag corner is outside of the convex hull, and the bag will not fit in this position. The algorithm continues to the next bin vertex 402. Otherwise, additional adjacent pairs of bin vertices 415 will continue to be processed. If all remaining adjacent bin vertex pairs 415 also result in a value less than zero, then the fourth corner fits, and since all corners are within the convex hull, the bag fits 409. The algorithm then finishes 411.

If all bin vertices 412 have been checked for corner fits, and all of them fail for one of the corner checks, then the bag does not fit in any rotated position within the bin 410. The algorithm then finishes 411.

Figure 5:
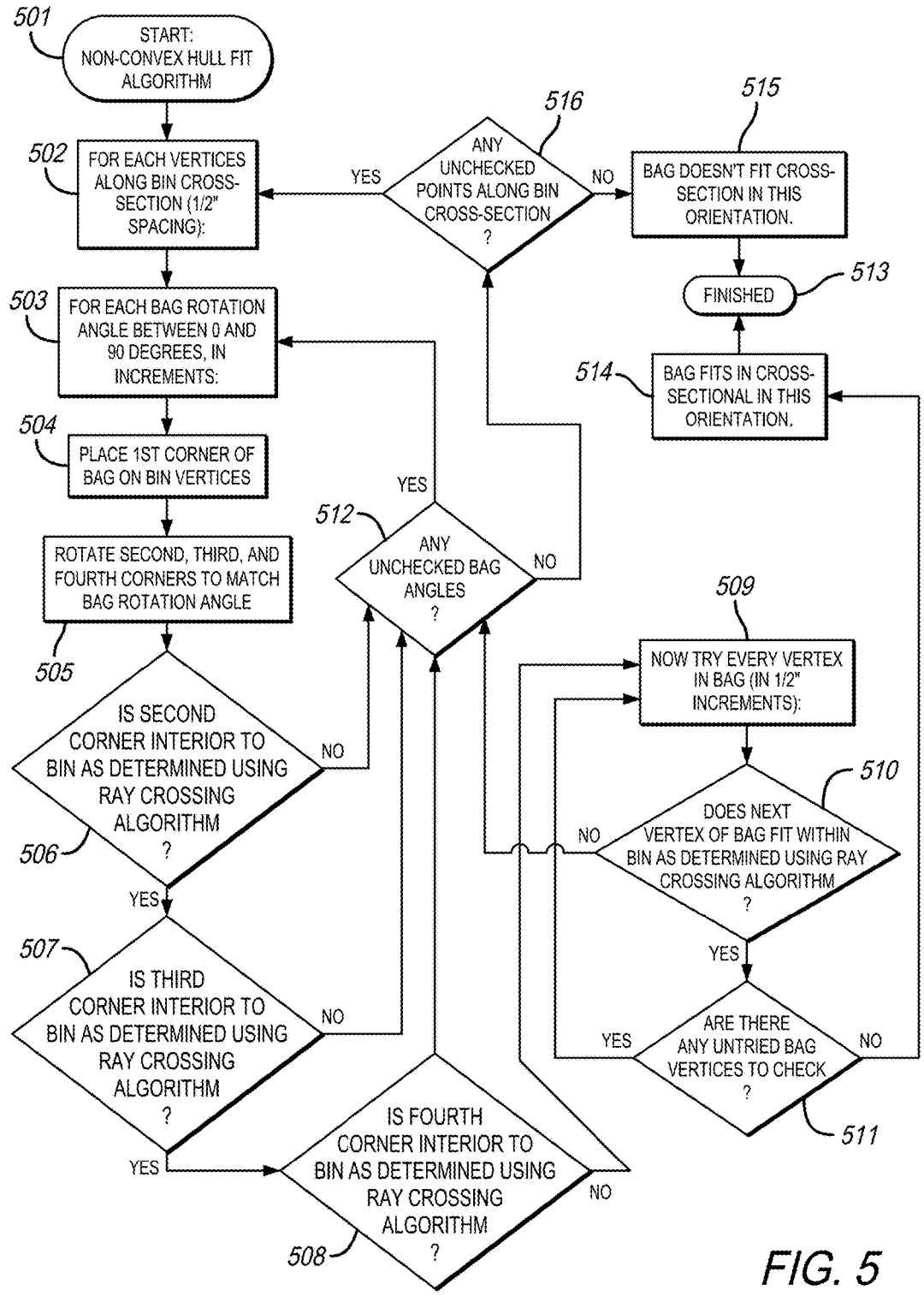
FIG. 5 is a flow chart illustrating the steps performed to determine whether a cross-section of a bag fits within a bin cross-section where the bin cross-section is a non-convex hull in accordance with a preferred embodiment of the present invention.

FIG. 5 is a flow chart illustrating the algorithm used to determine whether a bag cross-section fits within a bin cross-section where the bin cross-section is a non-convex hull. In a preferred embodiment, the algorithm begins 501 with the assumption that the bin cross-section has a high density of vertices. In a preferred embodiment, the vertex density is one vertex at least every ½". However, those of ordinary skill in the art will appreciate that any other density may be used, which may result in a change to the computational time, and may have an impact on the accuracy of the results.

Preferably, as shown in FIG. 5, for each vertex along the bin cross-section 502 (the vertex currently being processed is also referred to herein as the "query vertex"), it is attempted to place the bag at a range of bag rotation angles 503, ranging between zero and ninety degrees. In a preferred embodiment these angles are incremented in increments of 3 degrees. However, those of ordinary skill in the art will appreciate that these rotation angles are merely exemplary and that other rotation increments may also be used to place the bag. An arbitrary corner of the bag, referred to as the first corner, is placed coincident with the query vertex 504. The remaining corners of the bag are rotated around the first corner, as dictated by the bag rotation angle 505. Using a ray crossing algorithm to determine if the corner is interior to the bin, the second 506, third 507, and fourth 508 corners of the bag are checked to determine if they are interior to the bin cross-section. If any of them are outside of the cross-section, the bag does not fit at the current rotation angle, and a subsequent rotation angle 512 is attempted.

Preferably, as shown in FIG. 5, if all four corners fit, the remaining bag vertices must also be checked, because a non-convex hull can "pierce" the rectangular space of the bag. Every bag vertices 509 is therefore checked using the ray crossing algorithm 510. If any bag vertex is outside of the bin cross-section, then the bag does not fit in the currently attempted rotation, and a subsequent rotation angle 512 is attempted. If all bag vertices have been attempted 511 and they are all within the bin cross-section, then the bag fits within the cross-section 514, and the algorithm finishes.

In a preferred embodiment, as shown in FIG. 5, once all rotation angles have been attempted 512, the algorithm moves on to the next vertex along the bin cross-section 516. If all bin vertices have been attempted, and the bag does not fit 516, then the bag cannot be fit into the cross-section 515 regardless of location or rotation angle. The algorithm then finishes 513.

Figure 6:
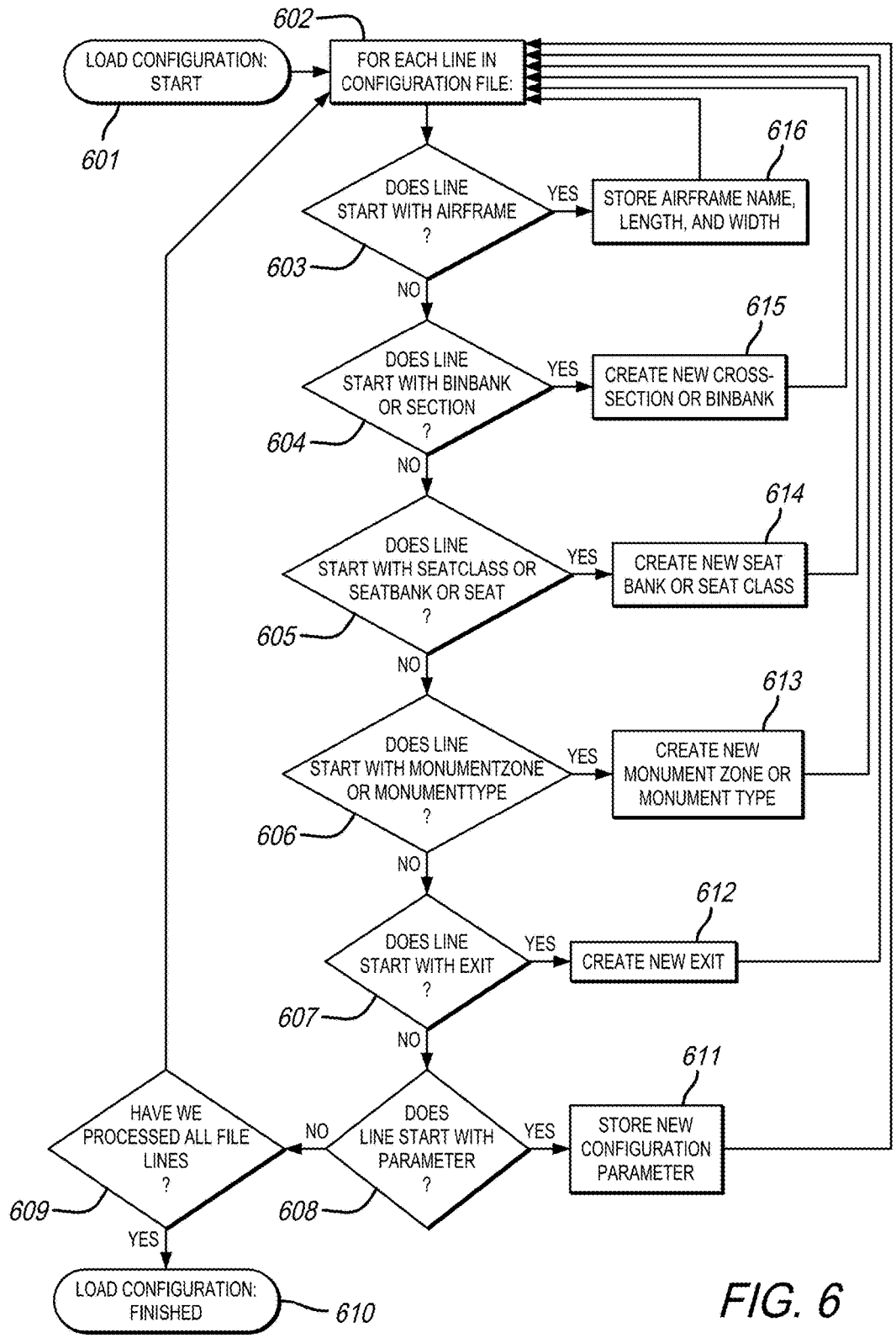
FIG. 6 is a flow chart illustrating the steps performed to load an airframe data in accordance with a preferred embodiment of the present invention.

FIG. 6 is a flow chart illustrating the algorithm used in accordance with a preferred embodiment to load an airframe simulation configuration (also referred to herein as airframe data) from a file. Preferably, the file format defines a parameter with first word of each line. Then, for each line within the file 602, the first word drives the sort of data structure that should be created in RAM, and drives the parsing of the remaining stored variables necessary to instantiate a data structure. By way of example, a row in the airframe data might define one BINBANK object, having a name and storing the length, side, wall, position, and number of bins within the BINBANK. By way of further example, preferably, the airframe data can also define seat classes, monument zones (areas in which monuments may be placed into the airframe), the location, side, and width of exits, and other parameters pertinent to the layout of an airframe. Those of ordinary skill in the art will appreciate that the use of a file to house airframe data is merely exemplary and that airframe data may be stored as one or more tables within a database, or within or as any other data structure. Likewise, those of ordinary skill in the art will appreciate that the specific data structures, values and parameters defined in the airframe data are merely exemplary and that any other data structures, values, and parameters related to the loading of an airframe may be utilized.

Figure 7:
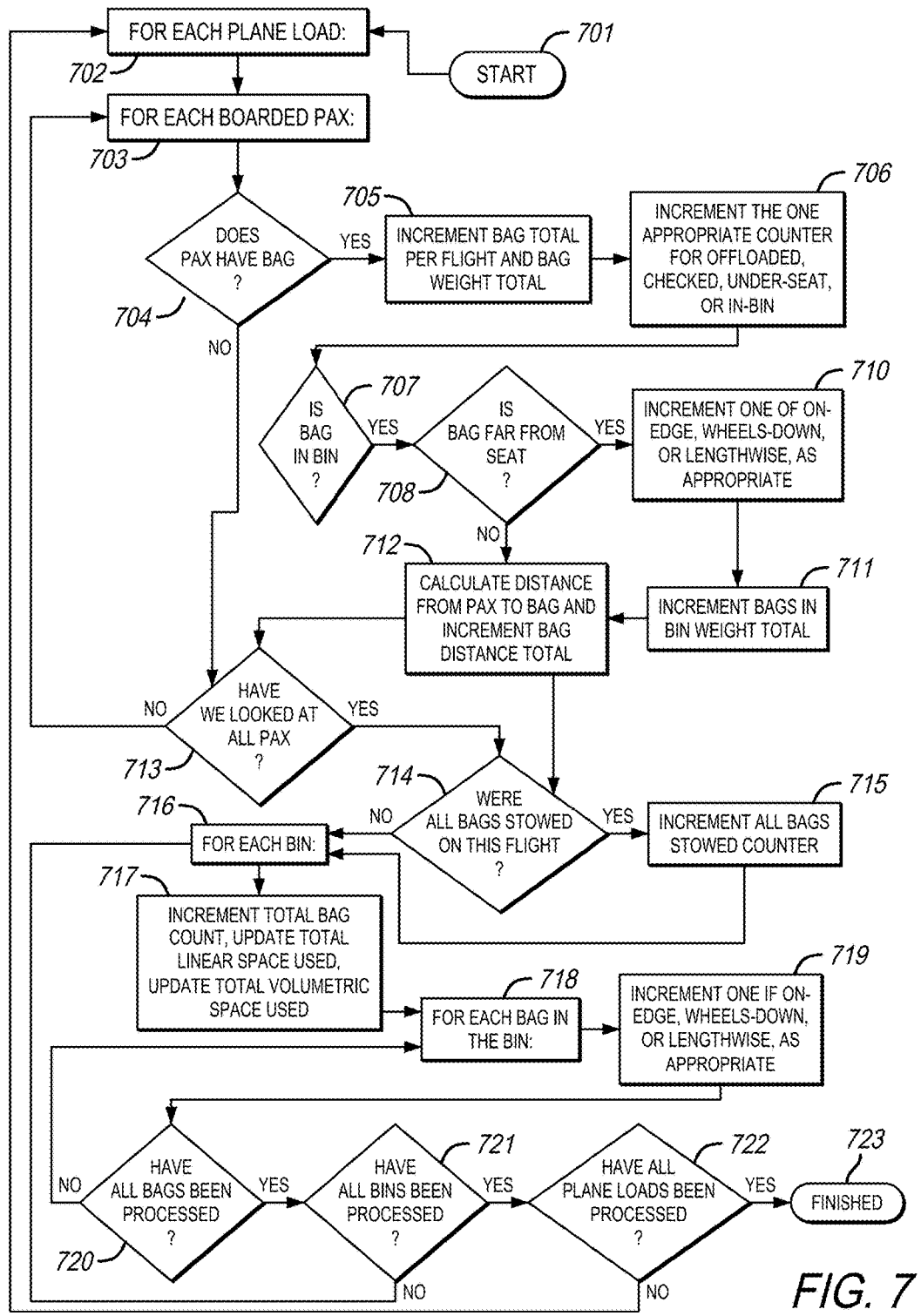
FIG. 7 is a flow chart illustrating the steps performed to gather statistical data from simulation results in accordance with a preferred embodiment of the present invention.

FIG. 7 is a flow chart illustrating the algorithm used to gather statistical data from the simulation results. In a preferred embodiment, as shown in FIG. 7, having generated simulation data as described in previous figures, the data is now analyzed 701. Preferably, as shown in FIG. 7, preferably, each plane load is looked at in turn 702. For each plane load, all boarding passengers are examined in turn 703. For each passenger with a bag 704, the bag totals and bag weight totals are incremented 705. Depending on the placement of the bag (offloaded, checked, under-seat, or in-bin) the appropriate total is updated 706. If the bag has been placed in a bin, and is far from the seat 708, a "far-from-seat" counter is incremented 709.

Preferably, depending on the orientation of the bag, the appropriate total (on-edge, wheels-down, or lengthwise) is incremented 710. The total weight of all bags in the bins 711 is also tracked. The distance between the bag and the passenger is calculated, and that value is added to a running total 712. This process continues for all passengers 713. If none of the bags were offloaded 714, a counter tracking the number of plane loads wherein all bags were successfully stowed is incremented 715.

In a preferred embodiment, as shown in FIG. 7, bin statistics are then calculated by looking at each bin individually 716. As each bin is processed, the total number of bags that have been placed in each bin is added to a running total, and running totals of linear space used and volumetric space used are also kept 717. For each bag in the bin 718, a counter is incremented based on bag orientation 719. This process continues for all of the bags 720, and all of the bins 721. The process repeats for each plane load 722. Once all plane loads have been processed 723, all of the values collected are divided by the number of plane loads. Preferably, this results in statistically meaningful average values for all of the collected information.

Figure 8:
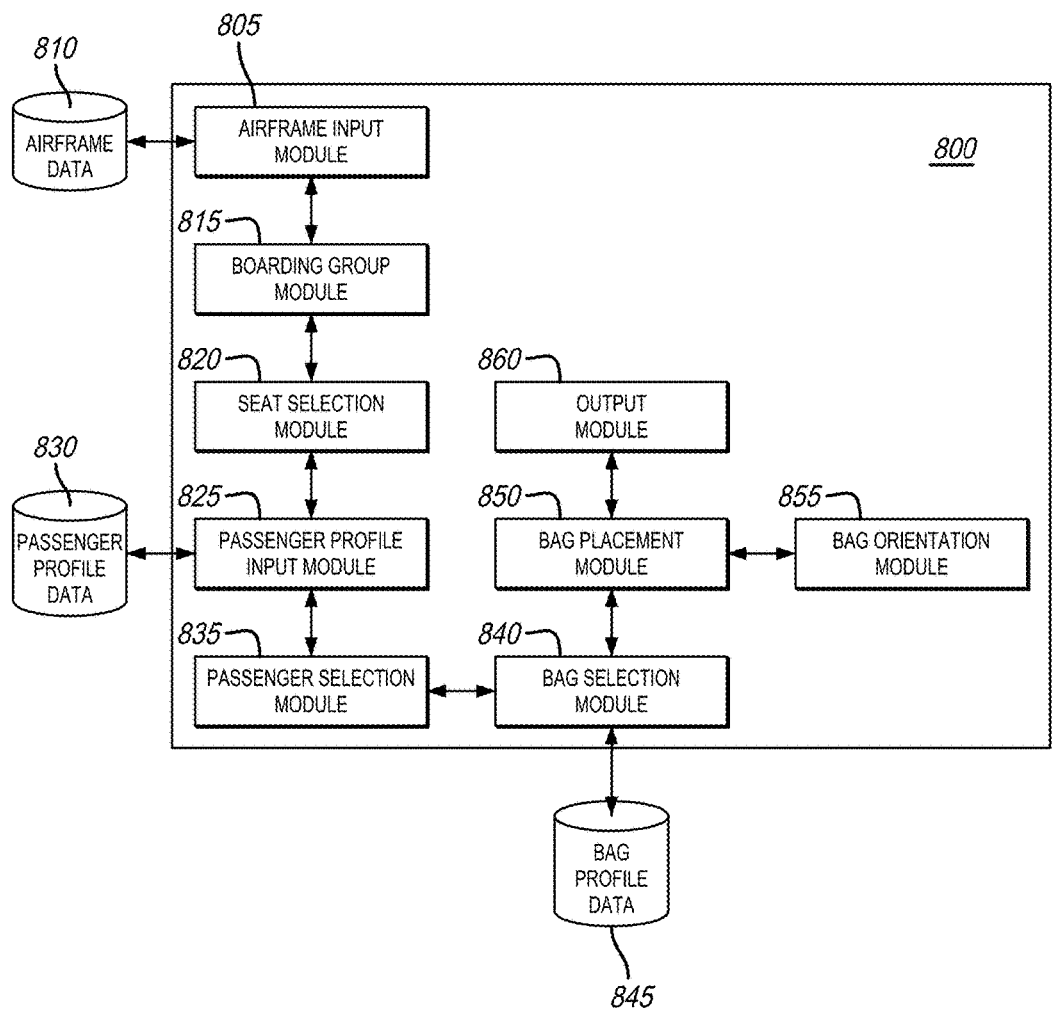
FIG. 8 is a diagram showing the components and the flow of data therebetween in accordance with a preferred embodiment of the present invention.

FIG. 8 illustrates a preferred embodiment of the present invention. As shown in FIG. 8, in a preferred embodiment, there is provided an application 800 for simulating the loading of an airframe. Preferably, the application 800 includes an airframe input module 805, which receives data from airframe data 810 and loads it into memory for further use by the application 800. In a preferred embodiment and as described above, the airframe data 810 is stored as a file that is accessed by the application 800. However, those of ordinary skill in the art will appreciate that the airframe data 810 can be stored in a relational database, a file, or via any other structure or method for storing data and retrieving data.

In a preferred embodiment, as shown in FIG. 8, the application 800 includes a boarding group module 815, which generates a list of boarding groups, each comprising a sub-set of the seats on the airframe, as described above with reference to FIG. 1. Preferably, the application 800 also includes a seat selection module 820, which takes a boarding group from the boarding group list generated by the boarding group module 815, and then iterates through each boarding group and selects each seat within each boarding group in turn, for further processing.

As shown in FIG. 8, preferably, the application 800 also includes a passenger profile input module 825, which receives data from passenger profile data 830 and loads it into memory for further use by the application 800. In a preferred embodiment and as described above, the passenger profile data 830 is stored as a file that is accessed by the application 800. However, those of ordinary skill in the art will appreciate that the passenger profile data 830 can be stored in a relational database, a file, or via any other structure or method for storing data and retrieving data.

In a preferred embodiment, as shown in FIG. 8, the application includes a passenger selection module 835, which, for each seat selected in turn by the seat selection 820 as described above, randomly selects a passenger profile loaded into memory by the passenger profile input module 825. Preferably, the passenger selection module 835 determines whether a passenger has a bag 111, as described above with regard to FIG. 1. However, those of ordinary skill in the art will appreciate that the passenger selection module 835 can also directly retrieve passenger profile data 830, or that the functionality of the passenger profile input module 825 and the passenger selection module 835 can be performed by a single module or multiple modules.

Preferably, as shown in FIG. 8, the application includes a bag selection module 840. The bag selection module is in connection with bag profile data 845. If it is determined that the passenger selected by the passenger selection module 835 has a bag, then the bag selection module 840 randomly selects a bag profile from the bag profile data 845 and then associates a bag having that bag profile with the selected passenger.

In a preferred embodiment, as shown in FIG. 8, the application 800 also includes a bag placement module 850 in connection with a bag orientation module 855. Preferably, the bag placement module 850 works with the bag orientation module 855 to place the bag into a bin in accordance with the airframe data 810, the passenger profile data 830, and the bag profile data 845, as described above with reference to FIGS. 1-3. However, those of ordinary skill in the art will appreciate that the functionality of the bag placement module 850 and the bag orientation module 855 can be performed by a single module or multiple modules.

Preferably, as shown in FIG. 8, the application 800 also includes an output module 860, which displays the results of one or more simulations. In a preferred embodiment, the output module 860 stores the results of the one or more simulations into memory. However, those of ordinary skill in the art will appreciate that the output module 860 may store the results of the one or more simulations in a database, file or any other structure or method for storing data. Preferably, the output module 860 also includes a comparison module, for generating and displaying comparisons of two or more simulation results. It will be appreciated by those of ordinary skill in the art that the application 800 may run and then compare two or more simulations using different airframe data, passenger profile data, and/or bag profile data. It will also be appreciated by those of ordinary skill in the art that the comparison module can also average the results of multiple simulations, and then generate and display a comparison between two or more averages of multiple simulations.

Figure 9:
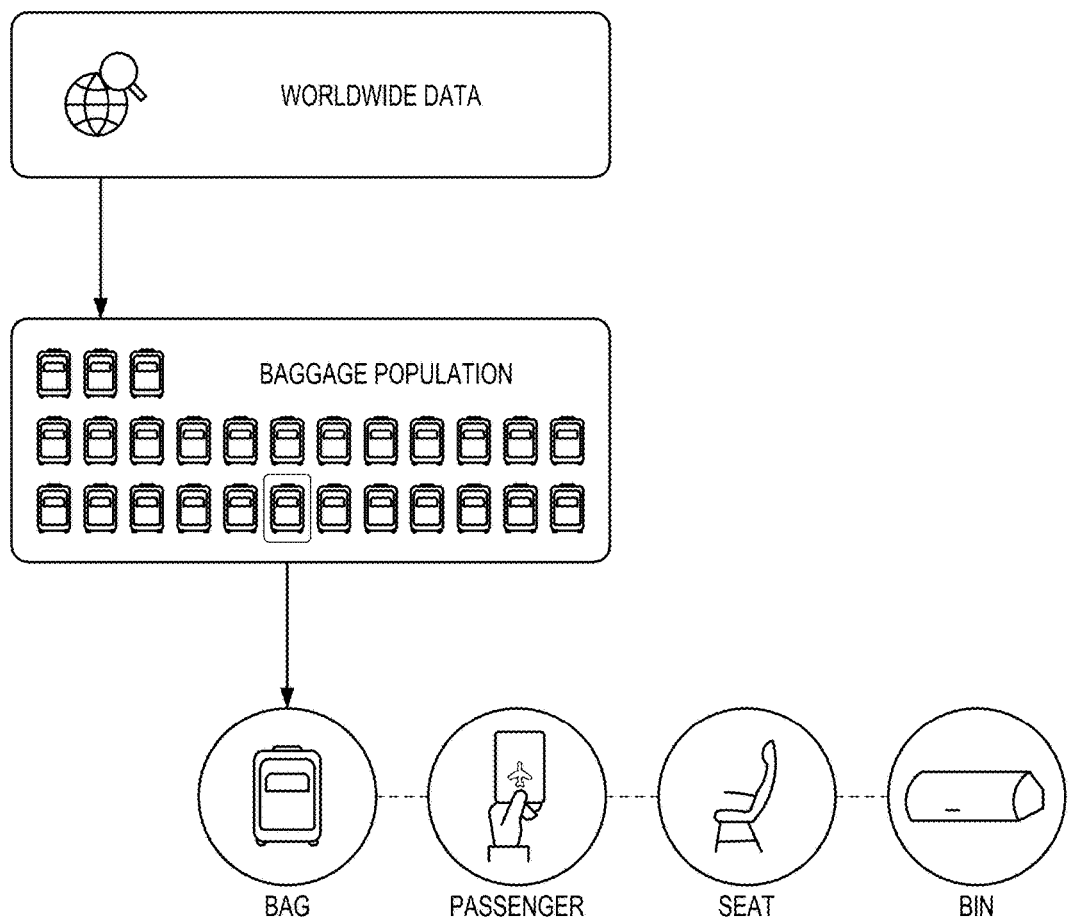
FIG. 9 is a diagram illustrating the association between a bag, a passenger, a seat, and a bin in accordance with a preferred embodiment of the present invention.

FIG. 9 provides a general illustration of the relationship between bags, passengers, seats, and bins in a simulation. As shown in FIG. 9, in a preferred embodiment, the population of bag profiles in the bag profile data 845, the distribution of passengers in the passenger profile data 830, and the location and number of seats and bins in the airframe data 810, are loaded from external sources. For example, preferably, the bag profile data is loaded from American, European, or Worldwide databases. Preferably, passengers are assigned a probability of boarding with either one or no carry-on bags. Once a bag or lack thereof are assigned to a passenger, the passenger is then assigned a seat. Each seat has a predefined assigned bin, which tells the simulated passenger where to begin attempting to load her bag. Those of ordinary skill in the art will appreciate that the population of bag profiles in the bag profile data 845, the distribution of passengers in the passenger profile data 830, and the location and number of seats and bins in the airframe data 810, can also be entered or manipulated by a user using the application 800.

Figure 10:
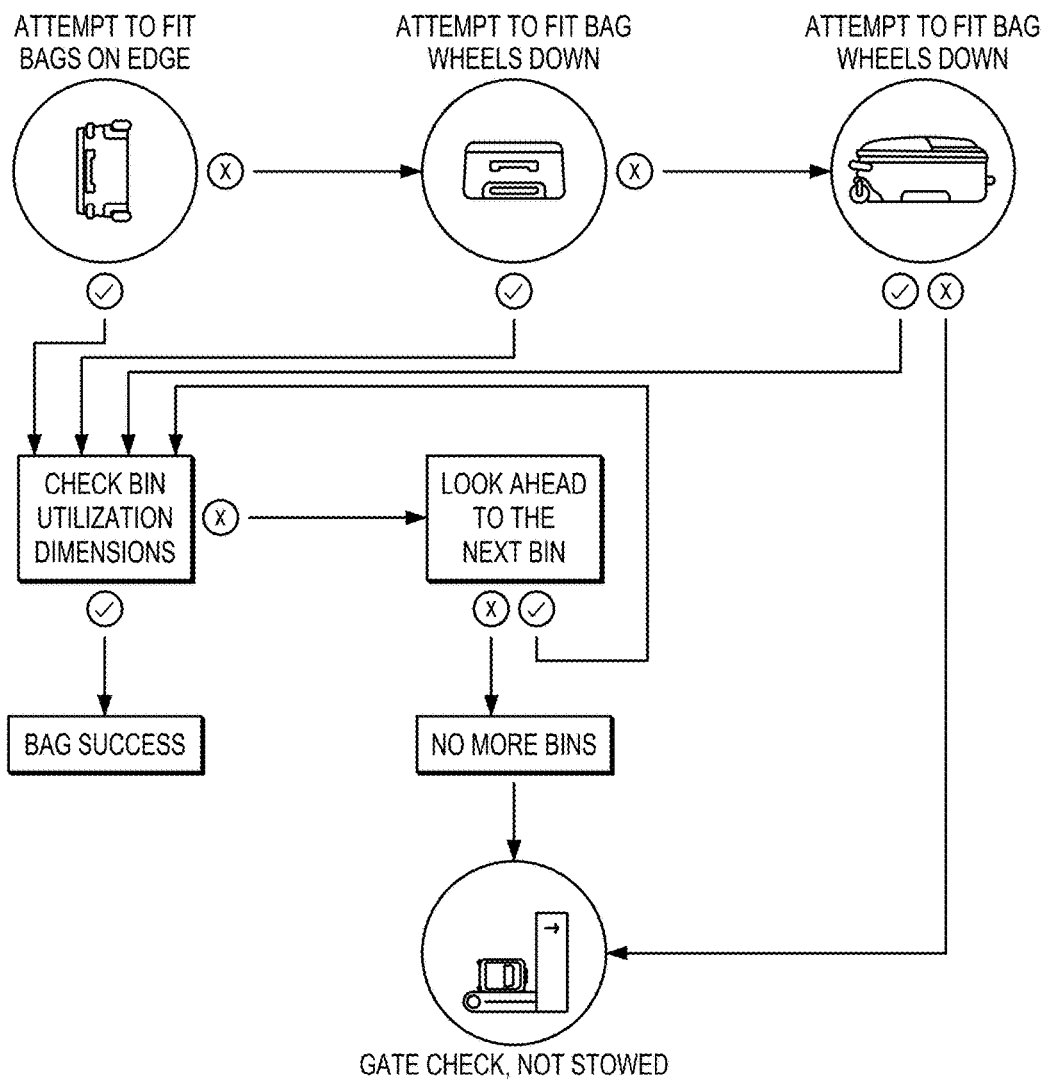
FIG. 10 is a diagram illustrating the associations between a bag, a passenger, a seat, and a bin in accordance with a preferred embodiment of the present invention.

FIG. 10 illustrates the general steps performed by the bag placement module 850 and the bag orientation module 855, and the steps for attempting to fit the bag into a bin at various orientations, including for example steps 215 through 220 described above. In a preferred embodiment, as shown in FIG. 10, the bag orientation module 855 attempts to place the bag into a bin at various orientations in turn; if the bag does not fit at one orientation, the bag orientation module 855 then attempts another location until the number of orientations is exhausted. In the event all attempts to fit a bag into a bin at any orientation fail, the bag placement module 850 can also look ahead to the next bin and then the bag orientation module 855 can attempt to fit the bag into the next bin at other orientations. Those of ordinary skill in the art will appreciate that the order of operations described herein is merely exemplary and that the operations can be performed in any order. By way of example, the bag placement module 850 can also iterate through available bins while attempting to place a bag in each bin at a first orientation, and then if the bag does not fit into any of the available bins at a first orientation, the bag placement module 850 can iterate through available bins while attempting to place the bag at a second orientation, and so on.

Figure 11A:
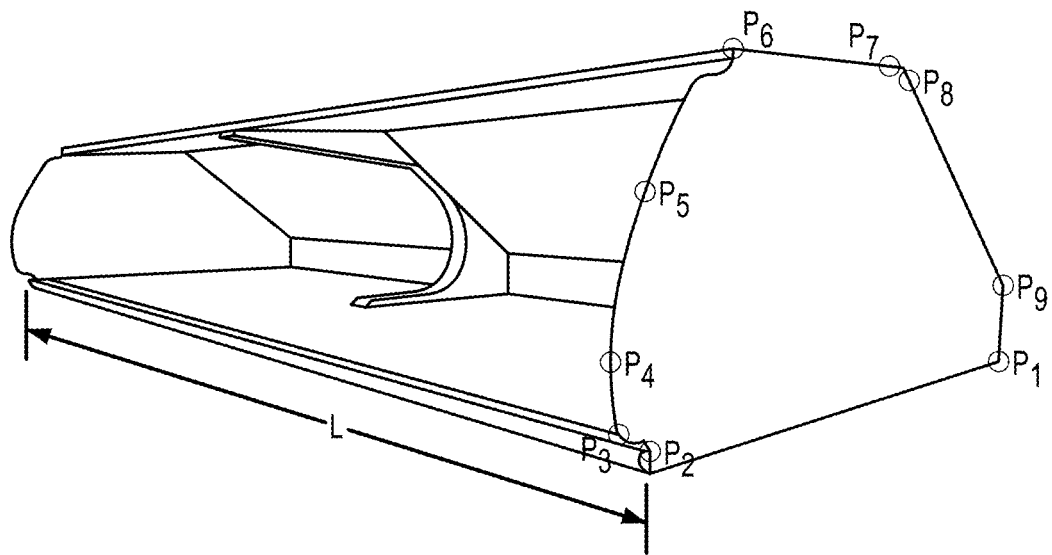
FIGS. 11A and 11B are diagrams showing how bins are defined by sets of vertices in order to determine the volume of space available for bags therein, in accordance with a preferred embodiment of the present invention.
Figure 11B:
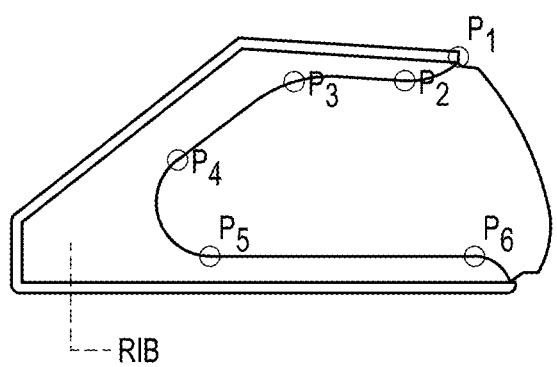

FIGS. 11A and 11B illustrate how bins are defined by a set of vertices that trace the perimeter of the bin's usable space in a preferred embodiment. Preferably, the bin compartment length is the dimension that runs along the length of the airframe. In a preferred embodiment, the standard bin is a single A320 Enhanced bin having a single compartment. However, those of ordinary skill in the art will appreciate that any bin may be utilized and preferably, defined in the airframe data 810. For example, pivot bins might be used, which would have two bin compartments per 4 airframes. As described above, the standard A320 Enhanced bin has a structural rib in the middle of the bin, which rib still allows some bags to be stowed in a limited capacity.

Figure 12A:
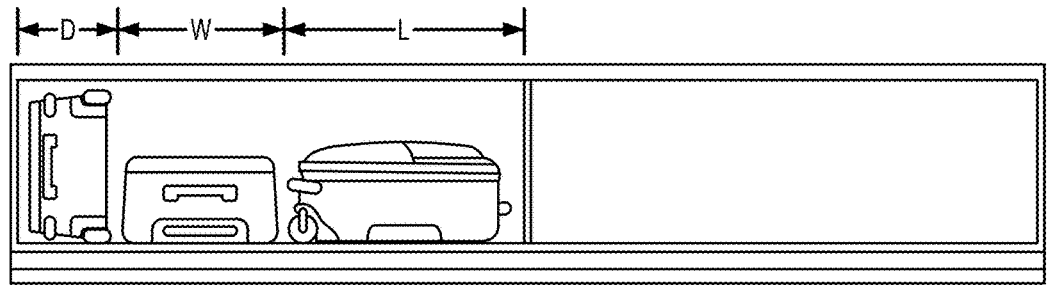
FIGS. 12A through 12D are diagrams demonstrating the loading of bags into bins on the airframe at various orientations in accordance with a preferred embodiment of the present invention.
Figure 12B:
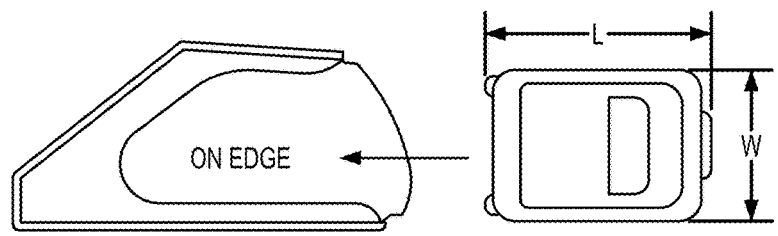
Figure 12C:
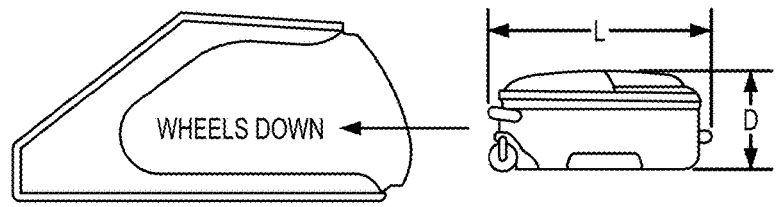
Figure 12D:
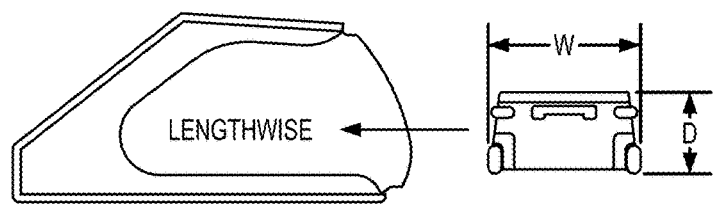

FIGS. 12A through 12D show the loading of bags into bins at various orientations. In a preferred embodiment, bags may be placed into a bin on edge (FIG. 12B), wheels down (FIG. 12C), or lengthwise (FIG. 12D). Preferably, as explained above, the application 800 attempts to optimize the bag's placement while remaining within the bounds of the bin profile, first on edge, then wheels down, then lengthwise. If the bag is successfully placed in one of these orientations, then the application 800 will subtract the bag's dimension along the length of the bin from the length of available bin space. If the bag does not fit in any orientation, then the simulated passenger will check adjacent bins for space (described herein as the "lookahead" function) and go through the same process.

Figure 13A:
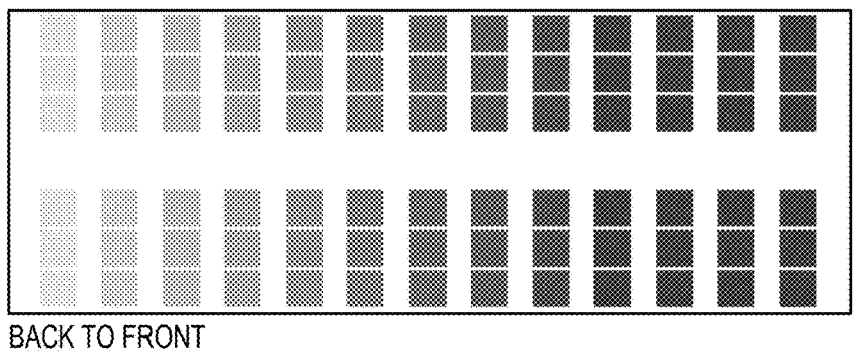
FIGS. 13A through 13C are diagrams showing different boarding orders for the boarding of passengers onto an airframe, which can be used in a simulation in accordance with a preferred embodiment of the present invention.
Figure 13B:
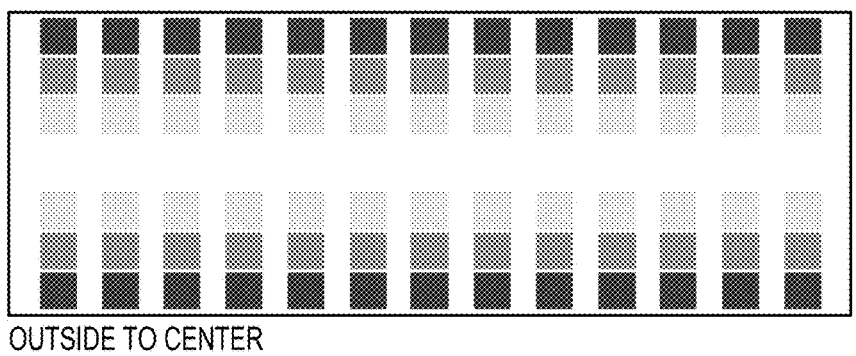
Figure 13C:
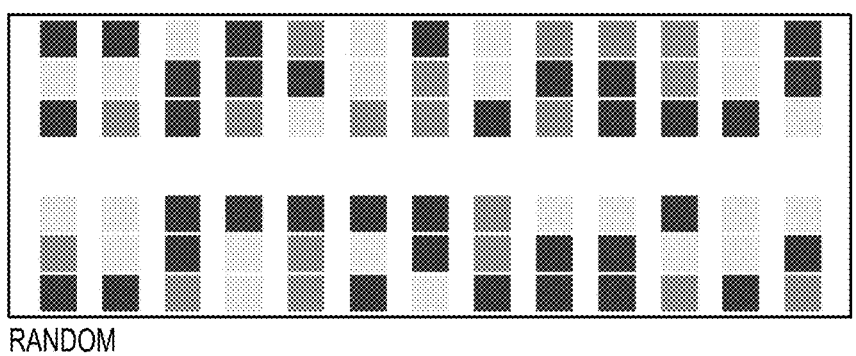

FIGS. 13A through 13C demonstrate three boarding orders that can be simulated in accordance with a preferred embodiment. For example, FIG. 13A shows a back to front filling of an airframe, whereby passengers fill the airframe beginning at the aft and then fill seats toward the fore. FIG. 13B shows an outside-in boarding order, whereby passengers fill the window seats first, and then fill seats toward the aisle. FIG. 13C shows a random filling of seats, whereby passengers board the airframe in a random order. Those of ordinary skill in the art will appreciate that any boarding order may be defined and used by in a simulation.

Figure 14:
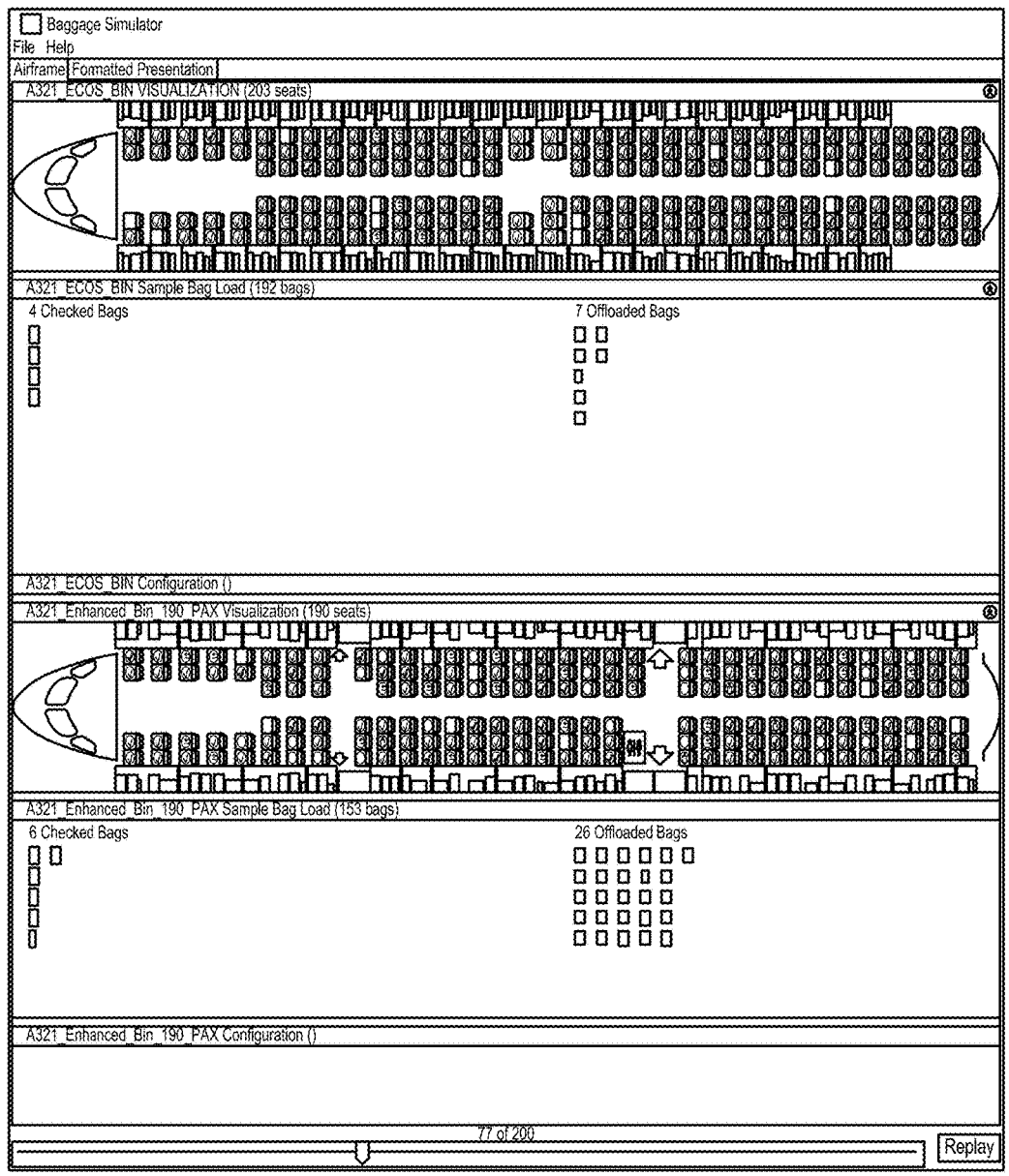
FIGS. 14-16 are screenshots showing the presentation of the results of two simulation iterations as displayed by and in accordance with a preferred embodiment of the present invention.

FIG. 14 shows the output from the output module 860 in a preferred embodiment. As shown in FIG. 14, there are two simulations that have been run and the comparison module presents the two simulations for comparison. As shown in FIG. 14, the airframe is an A321, but the number of bags and the type of bin are different. The seat locations, seat pitches, bin dimensions, monuments, exits, and bag dimensions are all shown in a WYSIWYG format, wherein the proper dimensional ratio between the different components is maintained. As shown in FIG. 14, the output module 860 generates a graphical depiction of each of the seats and bins on the two airframes which the loading simulations are run on, including indicators showing whether those seats and bins are occupied. The output module 860 also indicates how many bags are checked and how many are offloaded during a simulation. Preferably, as shown in FIG. 14, there are graphical icons within each displayed seat to indicate whether that seat is occupied, and if so, where an associated bag (if any) has been placed. In a preferred embodiment, a seat without an icon is displayed to represent an empty seat, a seat with a white circle in it to represent a passenger without a bag, a seat with a white circle having a green check mark to represent that a passenger placed in that seat has a bag in a nearby bin, a seat with a white circle having a yellow check mark to represent that a passenger placed in that seat has a bag in a distant bin, a seat with a white circle containing a yellow tag to represent that a passenger placed in that seat has checked a bag, a seat with a white circle containing a red "u-turn" symbol to represent that a passenger placed in that seat has a bag that was offloaded, a seat with a white circle and black rectangle to represent that a passenger placed in that seat has a bag stored under the seat. However, those of ordinary skill in the art will appreciate that any icons and/or colors may be used to graphically depict the status of a simulation.

Figure 15:
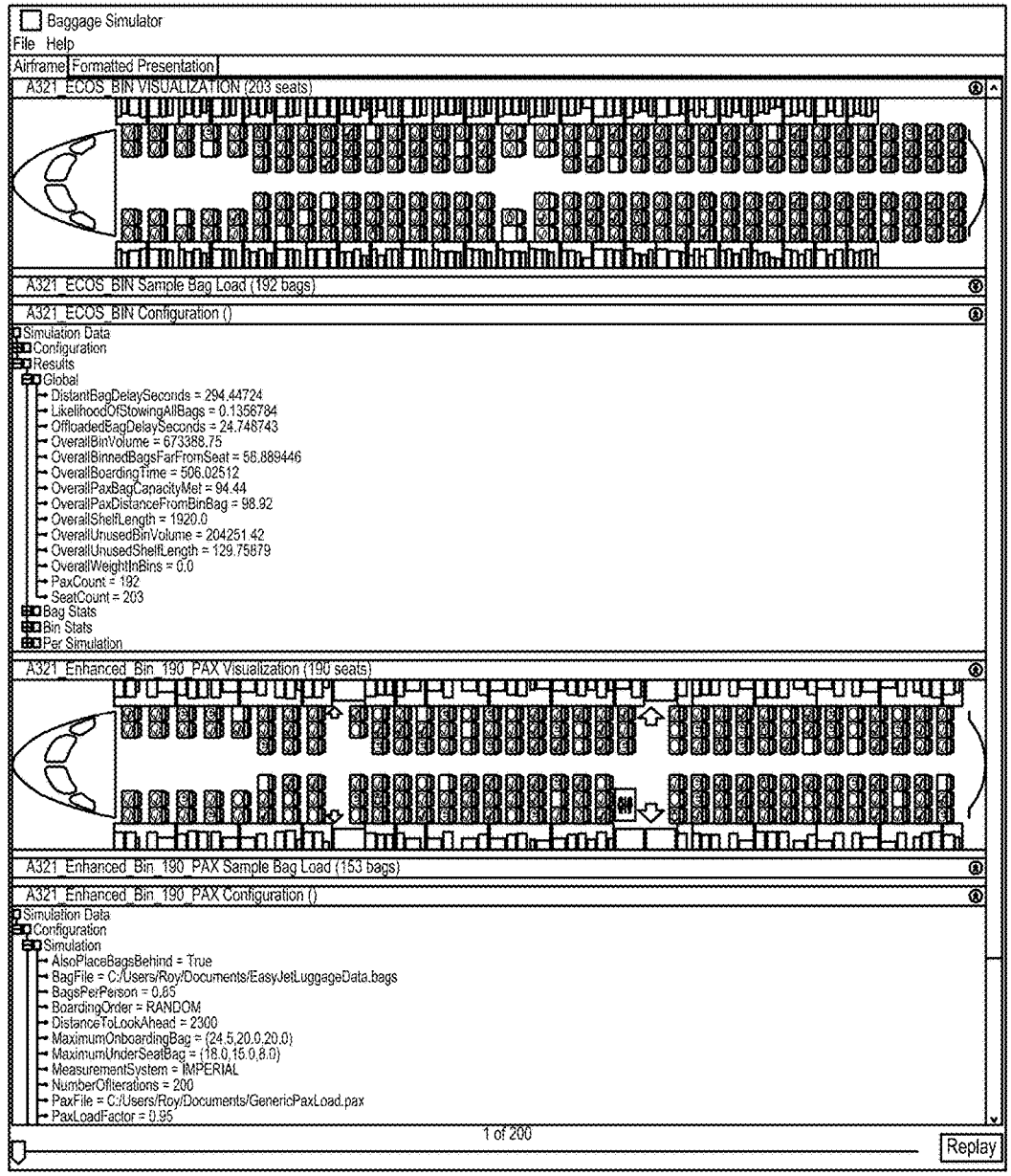
Figure 16:
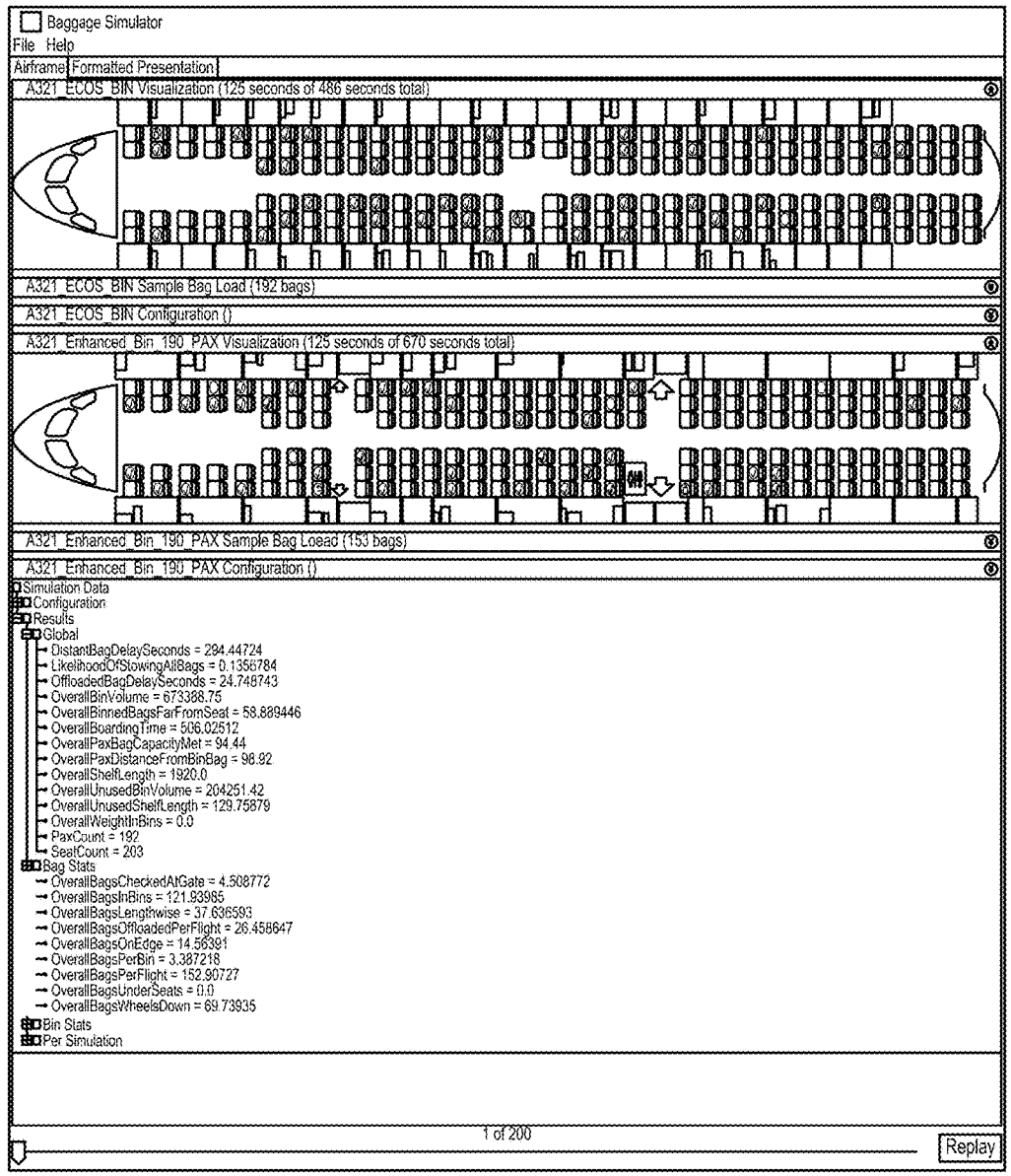

FIGS. 15 and 16 show additional output from the output module 860 in a preferred embodiment. As shown in FIGS. 15 and 16, a user can view and edit configuration data which is stored in airframe data 810.

Figure 17:
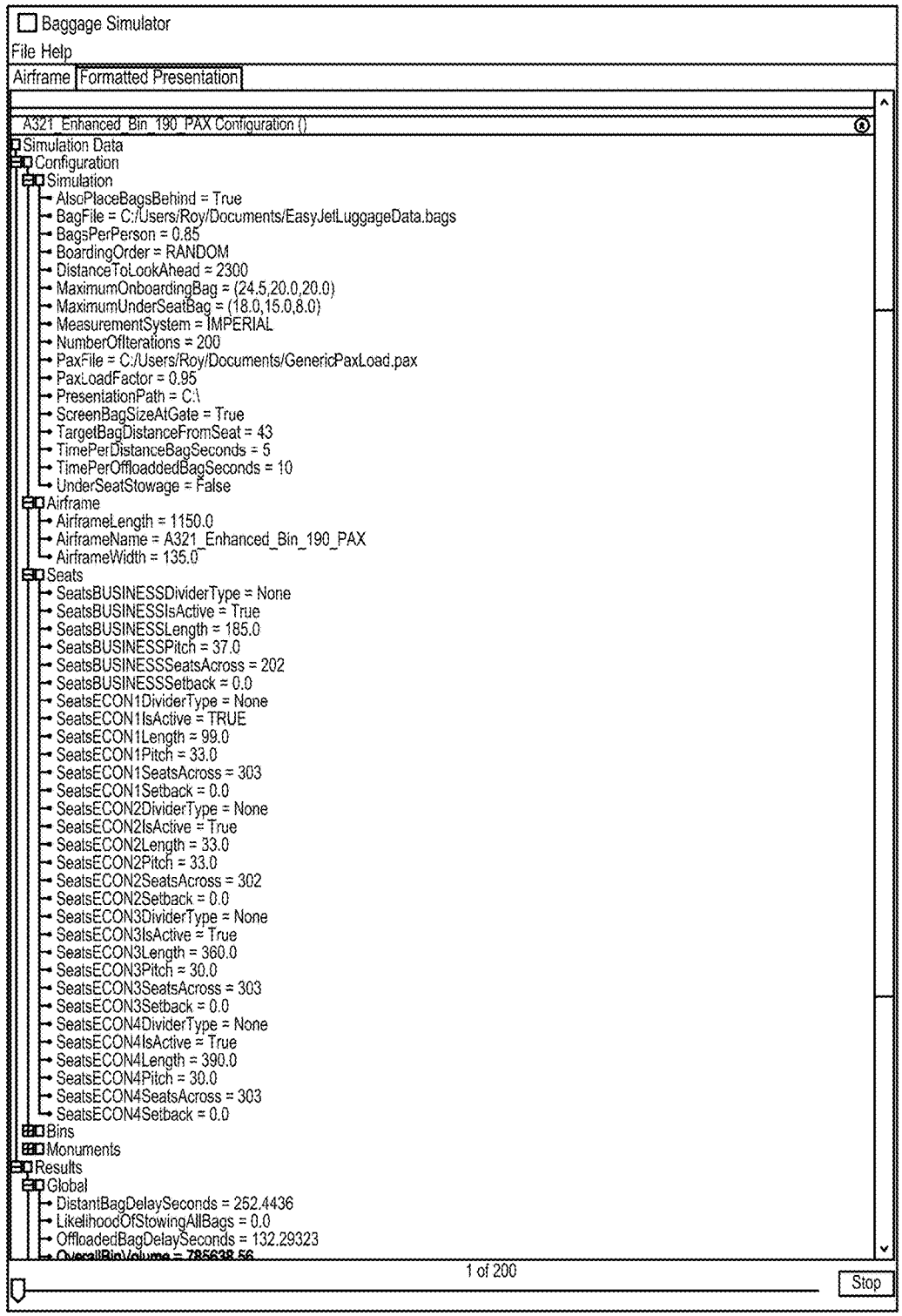
FIG. 17 is a screenshot showing the presentation of airframe configuration data (airframe profile data) as displayed by and in accordance with a preferred embodiment of the present invention.

FIG. 17 shows additional configuration data that can be viewed and manipulated within the application 800.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above Detailed Description of the Preferred Embodiments using the singular or plural number may also include the plural or singular number respectively. The word "or" in reference to a list of two or more items, covers all of the following interpretations of the word: any of the items in the list, all of the items in the list, and any combination of the items in the list.

The above-detailed description of embodiments of the disclosure is not intended to be exhaustive or to limit the teachings to the precise form disclosed above. While specific embodiments of and examples for the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed, at different times. Further any specific numbers noted herein are only examples: alternative implementations may employ differing values or ranges.

The above-detailed description of embodiments of the disclosure is not intended to be exhaustive or to limit the teachings to the precise form disclosed above. While specific embodiments of and examples for the disclosure are described above for illustrative purposes, various equivalent modifications are possible within the scope of the disclosure, as those skilled in the relevant art will recognize. Further, any specific numbers noted herein are only examples: alternative implementations may employ differing values, measurements or ranges. It will be appreciated that any dimensions given herein are only exemplary and that none of the dimensions or descriptions are limiting on the present invention.

The teachings of the disclosure provided herein can be applied to other systems, not necessarily the system described above. The elements and acts of the various embodiments described above can be combined to provide further embodiments.

Any patents and applications and other references noted above, including any that may be listed in accompanying filing papers, are incorporated herein by reference in their entirety. Aspects of the disclosure can be modified, if necessary, to employ the systems, functions, and concepts of the various references described above to provide yet further embodiments of the disclosure.

These and other changes can be made to the disclosure in light of the above Detailed Description of the Preferred Embodiments. While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features or aspects of the disclosure with which that terminology is associated. In general, the terms used in the following claims should not be construed to limit the disclosures to the specific embodiments disclosed in the specification unless the above Detailed Description of the Preferred Embodiments section explicitly defines such terms. Accordingly, the actual scope of the disclosure encompasses not only the disclosed embodiments, but also all equivalent ways of practicing or implementing the disclosure under the claims.

While certain aspects of the disclosure are presented below in certain claim forms, the inventors contemplate the various aspects of the disclosure in any number of claim forms. For example, while only one aspect of the disclosure is recited as a means-plus-function claim under 35 U.S.C. § 112, ¶6, other aspects may likewise be embodied as a means-plus-function claim, or in other forms, such as being embodied in a computer-readable medium. (Any claims intended to be treated under 35 U.S.C. § 112, ¶6 will begin with the words "means for"). Accordingly, the applicant reserves the right to add additional claims after filing the application to pursue such additional claim forms for other aspects of the disclosure.

Accordingly, although exemplary embodiments of the invention have been shown and described, it is to be understood that all the terms used herein are descriptive rather than limiting, and that many changes, modifications, and substitutions may be made by one having ordinary skill in the art without departing from the spirit and scope of the invention.

What is claimed is:

1. A non-transitory machine-readable medium of a computing device storing an application for simulating the loading of an airframe, the application comprising:
   an airframe input module configured to receive a first airframe file representing a first airframe, the first airframe file having a first seat and a first bin, the first seat having a first seat location and the first bin having a first bin location and a first bin dimensions,
   a passenger profile input module configured to receive a passenger profile file having a list of passenger profiles,
   a passenger selection module configured to select from the list of passenger profiles a first passenger, and to associate the first passenger with the first seat,
   a bag selection module configured to select a first bag profile from a bag profile file and to associate the first bag with the first passenger,
   a bag placement module configured to simulate the placement of the first bag into the first bin based on the first bin dimensions, the first bin location, and the first bag profile,
   a boarding group generating module configured to generate a first boarding group list having a first boarding group, wherein the first boarding group represents at least a subset of seats within the first airframe,
   a seat selection module configured to select the first seat from the first boarding group, and
   a bag orientation module configured to simulate the placement of the first bag into the first bin at various orientations, wherein the bag orientation module is configured to place the first bag into the first bin at a first orientation, and
   an output module configured to output and store a first simulation output,
   wherein the first simulation output associates the first bag with the first bin.

2. The non-transitory machine-readable medium of claim 1 wherein if the first bag does not fit into the first bin at the first orientation, the bag orientation module is further configured to attempt to place the first bag into the first bin at a second orientation.

3. The non-transitory machine-readable medium of claim 2 wherein the application further comprises a convex hull bag placement module,
   wherein the first bin further includes a first bin sub-space representing at least a sub-section of the first bin,
   wherein the bag placement module is further configured to determine whether the first bin sub-space is a convex hull, and
   wherein if the bag placement module determines that the first bin sub-space is a convex hull, the convex hull bag placement module is configured to determine whether the first bag fits into the first bin sub-space.

4. The non-transitory machine-readable medium of claim 2 wherein the application further comprises a non-convex hull bag placement module,
   wherein the first bin further includes a first bin sub-space representing at least a sub-section of the first bin,
   wherein the bag orientation module is further configured to determine whether the first bin sub-space is a non-convex hull, and
   wherein if the bag orientation module determines that the first bin sub-space is a non-convex hull, the convex hull bag placement module is configured to determine whether the first bag fits into the first bin sub-space.

5. A non-transitory machine-readable medium of a computing device storing an application for simulating the loading of an airframe, the application comprising:
   an airframe input module configured to receive a first airframe file representing a first airframe, the first airframe file having a first seat and a first bin, the first seat having a first seat location and the first bin having a first bin location and a first bin dimensions,
   a passenger profile input module configured to receive a passenger profile file having a list of passenger profiles,
   a passenger selection module configured to select from the list of passenger profiles a first passenger, and to associate the first passenger with the first seat,
   a bag selection module configured to select a first bag profile from a bag profile file and to associate the first bag with the first passenger,
   a bag placement module configured to simulate the placement of the first bag into the first bin based on the first bin dimensions, the first bin location, and the first bag profile, and
   an output module configured to output and store a first simulation output,
   wherein the first simulation output associates the first bag with the first bin, and a bag distance module configured to calculate a first bag distance representing the distance between the first seat and the first bag.

6. The non-transitory machine-readable medium of claim 5 wherein the application further comprises a boarding time module configured to calculate, based on the first bag distance and the first passenger, a first boarding time representing the amount of time for the first passenger to board the first airframe, place the first bag into the first bin, and to sit in the first seat.

7. The non-transitory machine-readable medium of claim 6 wherein the application is further configured to run a second simulation, and wherein the output module is further configured to output and store a second simulation output.

8. The non-transitory machine-readable medium of claim 7 wherein the application further comprises a comparison module configured to present for comparison the first simulation output and the second simulation output.

9. A non-transitory machine-readable medium of a computing device storing an application for simulating the loading of an airframe, the application comprising:
   means for receiving a first airframe file representing a first airframe, the first airframe file having a first seat and a first bin, the first seat having a first seat location and the first bin having a first bin location and a first bin dimensions,
   means for receiving a passenger profile file having a list of passenger profiles,
   means for selecting from the list of passenger profiles a first passenger,
   means for associating the first passenger with the first seat,
   means for selecting a first bag profile from a bag profile file,
   means for associating the first bag with the first passenger,
   means for simulating the placement of the first bag into the first bin based on the first bin dimensions, the first bin location, and the first bag profile,
   means for associating the first bag with the first bin,
   means for generating a first boarding group list having a first boarding group that represents at least a subset of seats within the first airframe,
   means for selecting the first seat from the first boarding group, and
   means for simulating the placement of the first bag into the first bin at a first orientation, and
   means for outputting a first simulation output.

10. The non-transitory machine-readable medium of claim 9 further comprising means for attempting to place the first bag into the first bin at a second orientation, if the first bag does not fit into the first bin at the first orientation.

11. The non-transitory machine-readable medium of claim 10 wherein the first bin further comprises a first bin sub-space, and wherein the application further comprises means for determining whether the first bin sub-space is a convex hull and means for determining whether the first bag fits into the first bin sub-space, if it is determined that the first bin sub-space is a convex hull.

12. The non-transitory machine-readable medium of claim 10 wherein the first bin further comprises a first bin sub-space, and wherein the application further comprises means for determining whether the first bin sub-space is a non-convex hull and means for determining whether the first bag fits into the first bin sub-space, if it is determined that the first bin sub-space is a non-convex hull.

13. A non-transitory machine-readable medium of a computing device storing an application for simulating the loading of an airframe, the application comprising:
   means for receiving a first airframe file representing a first airframe, the first airframe file having a first seat and a first bin, the first seat having a first seat location and the first bin having a first bin location and a first bin dimensions,
   means for receiving a passenger profile file having a list of passenger profiles,
   means for selecting from the list of passenger profiles a first passenger,
   means for associating the first passenger with the first seat,
   means for selecting a first bag profile from a bag profile file,
   means for associating the first bag with the first passenger,
   means for simulating the placement of the first bag into the first bin based on the first bin dimensions, the first bin location, and the first bag profile,
   means for associating the first bag with the first bin, and
   means for outputting a first simulation output, and
   means for calculating a first bag distance representing the distance between the first seat and the first bag.

14. The non-transitory machine-readable medium of claim 13 wherein the application further comprises means for calculating, based on the first bag distance and the first passenger, a first boarding time representing the amount of time for the first passenger to board the first airframe, place the first bag into the first bin, and to sit in the first seat.

15. The non-transitory machine-readable medium of claim 14 wherein the application further comprises means for running a second simulation,
   means for storing a second simulation output, and
   means for outputting a second simulation output.

16. The non-transitory machine-readable medium of claim 15 wherein the application further comprises means for presenting for comparison the first simulation output and the second simulation output.

17. A computer-implemented method for simulating the loading of an airframe, comprising the steps of:
   receiving a first airframe file representing a first airframe, the first airframe file having a first seat and a first bin, the first seat having a first seat location and the first bin having a first bin location and a first bin dimensions,
   receiving a passenger profile file having a list of passenger profiles,
   selecting from the list of passenger profiles a first passenger,
   associating the first passenger with the first seat,
   selecting a first bag profile from a bag profile file,
   associating the first bag with the first passenger,
   simulating the placement of the first bag into the first bin based on the first bin dimensions, the first bin location, and the first bag profile,
   associating the first bag with the first bin,
   generating a first boarding group list having a first boarding group that represents at least a subset of seats within the first airframe,
   selecting the first seat from the first boarding group, and
   simulating the placement of the first bag into the first bin at a first orientation,
   if the first bag does not fit into the first bin at the first orientation, attempting to place the first bag into the first bin at a second orientation,
   calculating a first bag distance representing the distance between the first seat and the first bag, and
   calculating, based on the first bag distance and the first passenger, a first boarding time representing the amount of time it takes for the first passenger to board the first airframe, place the first bag into the first bin, and to sit in the first seat, and
   outputting a first simulation output.

* * * * *